(12) United States Patent  
Nakaone

(10) Patent No.: US 7,690,932 B2
(45) Date of Patent: Apr. 6, 2010

(54) ANISOTROPIC CONDUCTIVE SHEET AND METHOD OF MANUFACTURING THE SAME

(75) Inventor: Yutaka Nakaone, Tokyo (JP)

(73) Assignee: Polymatech Co., Ltd, Tokyo (JP)

( * ) Notice: Subject to any disclaimer, the term of this patent is extended or adjusted under 35 U.S.C. 154(b) by 404 days.

(21) Appl. No.: 11/783,954

(22) Filed: Apr. 13, 2007

(65) Prior Publication Data

US 2007/0249161 A1    Oct. 25, 2007

(30) Foreign Application Priority Data

Apr. 21, 2006 (JP) .............................. 2006-118582

(51) Int. Cl.
*H01R 4/58* (2006.01)
(52) U.S. Cl. ..................... 439/91; 257/773; 439/66; 439/86
(58) Field of Classification Search ............... 439/91; 438/637; 257/734, E23.027
See application file for complete search history.

(56) References Cited

U.S. PATENT DOCUMENTS

| 5,041,183 A | 8/1991 | Nakamura et al. |
| 6,052,286 A | 4/2000 | Worthen et al. |
| 6,580,035 B1 | 6/2003 | Chung |
| 6,581,276 B2 * | 6/2003 | Chung .................... 29/825 |
| 6,790,057 B2 * | 9/2004 | DelPrete et al. ............ 439/91 |
| 7,255,579 B2 * | 8/2007 | Sato et al. ................ 439/91 |
| 7,348,215 B2 * | 3/2008 | Lee ...................... 438/108 |
| 2003/0166312 A1 | 9/2003 | Lee |
| 2005/0017369 A1 | 1/2005 | Clayton et al. |

FOREIGN PATENT DOCUMENTS

| GB | 2 215 661 A | 9/1989 |
| JP | 2000-082512 | 3/2000 |

OTHER PUBLICATIONS

Written Opinion of ESR.
EPO Search Report dated May 15, 2007.

* cited by examiner

*Primary Examiner*—Michael C Zarroli
(74) *Attorney, Agent, or Firm*—Cermak Kenealy Vaidya & Nakajima LLP; Tomoko Nakajima

(57) ABSTRACT

Disclosed is an anisotropic conductive sheet which is equipped with an insulating base portion and a plurality of conductive portions extending through the base portion in a thickness direction thereof, which easily allows temporary fixation at a time of attachment thereof, and which, if pressurized, causes no adhesive material to be squeezed out onto the conductive contacts. An anisotropic conductive sheet includes a base portion and conductive portions exposed therethrough to form conductive contacts, with at least one of surfaces of the base portion having an adhesive portion spaced apart from the conductive contacts.

9 Claims, 17 Drawing Sheets

ANISOTROPIC CONDUCTIVE SHEET AND METHOD OF MANUFACTURING THE SAME

BACKGROUND OF THE INVENTION

1. Field of the Invention

The present invention relates to an anisotropic conductive sheet which is incorporated into an information apparatus such as a mobile phone, a personal handyphone system (PHS), a personal digital assistant (PDA), or a notebook computer, or an AV apparatus such as a small audio player, and which is used for electrical connection between various components and members, for example, between circuit boards, between a circuit board and an electronic component, or between a conductive portion provided in an exterior component of an apparatus and a circuit board.

2. Description of the Related Art

As shown in FIG. 20, an anisotropic conductive sheet (1) has, within a base portion (2) formed of an insulating elastic sheet, conductive portions (3) continuously extending therethrough in the thickness direction thereof, and exhibits conductivity in the sheet thickness direction of the sheet but exhibits no conductivity in the planar direction of the sheet, that is, exhibiting anisotropy. Electrical connection can be easily effected solely by bringing conductive contacts (4), which are exposed portions of the conductive portions (3), into press contact with the contact portions (electrode portions) of components or members even without employing such means as soldering or mechanical bonding. Further, since the base portion (2) retaining the conductive portions (3) is formed of rubber-like elastic material, it is also possible to absorb vibrations and impact from the outside.

This anisotropic conductive sheet, however, has a problem in that even if positioning is effected between the contacts of the components or members (not shown) and the conductive contacts (4) of the anisotropic conductive sheet (1), positional deviation is liable to occur before the anisotropic conductive sheet (1) has been completely mounted. To solve this problem, there has been proposed, in JP 2000-82512 A, an anisotropic conductive sheet (1a) in which, as shown in FIG. 21, an adhesive layer (5) is provided around the conductive portions (3). With this technique, due to the provision of the adhesive layer (5), when positioning is effected between the contacts of the circuit board and the anisotropic conductive sheet (1a), positional deviation does not easily occur even if some vibration or impact is applied to the anisotropic conductive sheet (1a). Further, even if the positioning is erroneously effected, the sheet can be easily peeled off, thus allowing re-positioning.

However, the anisotropic conductive sheet (1a) has a problem in that, when the sheet (1a) is pressurized at the time of mounting, some adhesive is caused to be squeezed out onto the conductive portions (3) to cover the conductive portions (3), resulting in an increase in conduction resistance.

SUMMARY OF THE INVENTION

The present invention has been made with a view toward solving the above-mentioned problems in the prior art. It is therefore an object of the present invention to provide an anisotropic conductive sheet which allows easy temporary fixation at the time of attachment of the anisotropic conductive sheet and which, if pressurized, causes no adhesive to be squeezed out onto the conductive contacts.

According to the present invention, there is provided an anisotropic conductive sheet including: an insulating base portion; and a plurality of conductive portions extending through the base portion in a thickness direction thereof, in which: the base portion has surfaces through which conductive portions are exposed to form conductive contacts; and at least one of the surfaces has an adhesive portion spaced apart from the conductive contacts.

Due to the provision of the adhesive portion that is out of contact with the conductive contacts on at least one surface of the base portion, in which the conductive contacts are formed through exposure of the conductive portions therefrom, there is no fear of the adhesive material being spread and squeezed out onto the conductive portions even if the sheet is pressurized after being mounted between a board, components, members, etc. where conduction is to be effected. Thus, there is involved no faulty conduction due to the covering of the conductive portions with the adhesive material.

In this anisotropic conductive sheet, the adhesive portion can be formed so as to be flush with the surfaces of the conductive contacts. By forming the adhesive portion such that the adhesive portion is flush with the surfaces of the conductive contacts, it is possible to bring the anisotropic conductive sheet into uniform contact with the board, components, and members, to which the anisotropic conductive sheet is to be attached. Thus, it is possible to secure sufficient conductivity and to effect the attachment by the adhesive material to a sufficient degree.

In forming the adhesive portion, it is possible to embed it in the base portion. By embedding the adhesive portion in the base portion, it is possible to prevent spreading of the adhesive material in the width direction of the anisotropic conductive sheet. Further, since the contact area between the adhesive material and the base portion increases and rubbing against the object of attachment does not easily occur, the adhesive material is not easily peeled off from the base portion and it is possible to suppress transfer of the adhesive material to the object of attachment, such as the board and electronic components, to which the anisotropic conductive sheet is to be attached.

Further, it is possible for the adhesive portion to be formed so as to protrude outwardly beyond the surfaces of the conductive contacts. By forming the adhesive portion such that the adhesive portion protrudes beyond the surfaces of the conductive contacts, it is possible to reliably effect the fixation of the anisotropic conductive sheet to the object of attachment. Further, even if the surface of the adhesive portion protrudes beyond the surfaces of the conductive contacts, the adhesive portion is spaced apart from the conductive contacts, so the adhesive material does not cover the conductive contacts even if the adhesive portion is spread as a result of pressurization.

The adhesive portion may be provided on a protrusion provided on the base portion and protruding in the thickness direction. Since the protrusion protruding in the thickness direction is provided on the base portion, and the adhesive portion is provided on the protrusion, it is possible to greatly deflect the protrusion by depression with low pressure. Thus, if the pressurization is weak, it is possible to attain a stable contact between the conductive contacts and the object of attachment. Further, if the adhesive material is spread as a result of pressurization, it only covers the protrusion, and does not cover the conductive contacts.

Further, it is possible to provide a conductive portion protruding in the thickness direction beyond the surface of the base portion, and to provide the adhesive portion on the surface of the base portion recessed from the surfaces of the conductive contacts. Due to the provision of the conductive portion protruding in the thickness direction beyond the surface of the base portion, and the provision of the adhesive portion on the surface of the base portion recessed from the surfaces of the conductive contacts, there is no fear of the adhesive material covering the conductive contacts even if it is spread as a result of pressurization.

The conductive portion may be formed by orienting conductive particles in the thickness direction of the anisotropic conductive sheet; by using magnetic particles, the conductive portion can be produced through solidification of the base portion after the formation of the conductive portion by magnetic force.

According to the anisotropic conductive sheet of the present invention, it is possible to secure stable conduction. Further, it is easy to mount, thus helping to improve workability.

The above description of the present invention should not be construed restrictively. The advantages, features, and uses of this invention will become more apparent from the following description given with reference to the accompanying drawings. Further, it should be understood that all appropriate modifications made without departing from the gist of this invention are to be covered by the scope of this invention.

BRIEF DESCRIPTION OF THE DRAWINGS

In the accompanying drawings:

FIGS. 1(A) through 1(C) show an anisotropic conductive sheet according to a first embodiment of the present invention, of which FIG. 1(A) is a sectional view taken along the line I(A)-I(A) of FIG. 1(B), FIG. 1(B) is a plan view, and FIG. 1(C) is a sectional view taken along the line I(C)-I(C) of FIG. 1(B);

FIGS. 6(A) through 6(C) show an anisotropic conductive sheet according a second embodiment of the present invention, of which FIG. 6(A) is a sectional view taken along the line VI(A)-VI(A) of FIG. 6(B), FIG. 6(B) is a plan view, and FIG. 6(C) is a sectional view taken along the line VI(C)-VI(C) of FIG. 6(B);

FIGS. 7(A) through 7(C) show an anisotropic conductive sheet according to a first modification of the second embodiment of the present invention, of which FIG. 7(A) is a sectional view taken along the line VII(A)-VII(A) of FIG. 7(B), FIG. 7(B) is a plan view, and FIG. 7(C) is a sectional view taken along the line VII(C)-VII(C) of FIG. 7(B);

FIGS. 8(A) through 8(C) show an anisotropic conductive sheet according to a second modification of the second embodiment of the present invention, of which FIG. 8(A) is a sectional view taken along the line VIII(A)-VIII(A) of FIG. 8(B), FIG. 8(B) is a plan view, and FIG. 8(C) is a sectional view taken along the line VIII(C)-VIII(C) of FIG. 8(B);

FIGS. 9(A) through 9(C) show an anisotropic conductive sheet according to a third modification of the second embodiment of the present invention, of which FIG. 9(A) is a sectional view taken along the line IX(A)-IX(A) of FIG. 9(B), FIG. 9(B) is a plan view, and FIG. 9(C) is a sectional view taken along the line IX(C)-IX(C) of FIG. 9(B);

FIGS. 10(A) and 10(B) show an anisotropic conductive sheet according to a third embodiment of the present invention, of which FIG. 10(A) is a sectional view taken along the line X(A)-X(A) of FIG. 10(B), and FIG. 10(B) is a plan view;

FIGS. 11(A) and 11(B) show an anisotropic conductive sheet according to a fourth embodiment of the present invention, of which FIG. 11(A) is a sectional view taken along the line XI(A)-XI(A) of FIG. 11(B), and FIG. 11(B) is a plan view;

FIGS. 12(A) and 12(B) show an anisotropic conductive sheet according to a first modification of the fourth embodiment of the present invention, of which FIG. 12(A) is a sectional view taken along the line XII(A)-XII(A) of FIG. 12(B), and FIG. 12(B) is a plan view;

FIGS. 13(A) and 13(B) show an anisotropic conductive sheet according to a second modification of the fourth embodiment of the present invention, of which FIG. 13(A) is a sectional view taken along the line XIII(A)-XIII(A) of FIG. 13(B), and FIG. 13(B) is a plan view;

FIGS. 14(A) and 14(B) show an anisotropic conductive sheet according to a third modification of the fourth embodiment of the present invention, of which FIG. 14(A) is a sectional view taken along the line XIV(A)-XIV(A) of FIG. 14(B), and FIG. 14(B) is a plan view;

FIGS. 15(A) and 15(B) show an anisotropic conductive sheet according to a fifth embodiment of the present invention, of which FIG. 15(A) is a sectional view taken along the line XV(A)-XV(A) of FIG. 15(B), and FIG. 15(B) is a plan view;

FIGS. 19(A) through 19(C) show an anisotropic conductive sheet according to a modification of the first embodiment of the present invention, of which FIG. 19(A) is a sectional view taken along the line XIX(A)-XIX(A) of FIG. 19(B), FIG. 19(B) is a plan view, and FIG. 19(C) is a sectional view taken along the line XIX(C)-XIX(C) of FIG. 19(B);

DESCRIPTION OF THE PREFERRED EMBODIMENTS

Figure 1A:
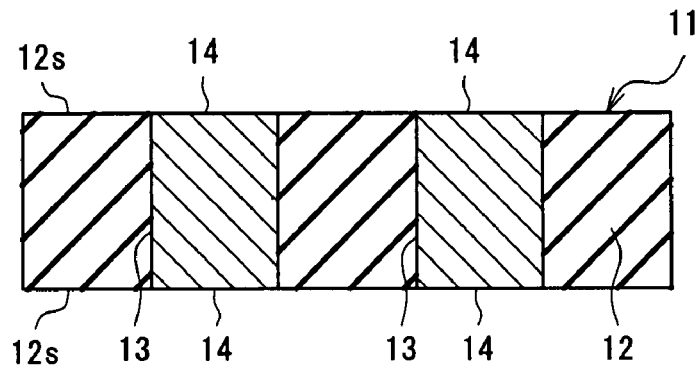

The present invention will be described in more detail with reference to the drawings. In the drawings, the reference numerals indicate portions and components. In the following, a redundant description of the materials and manufacturing method common to the various embodiments will be omitted.

Figure 1B:
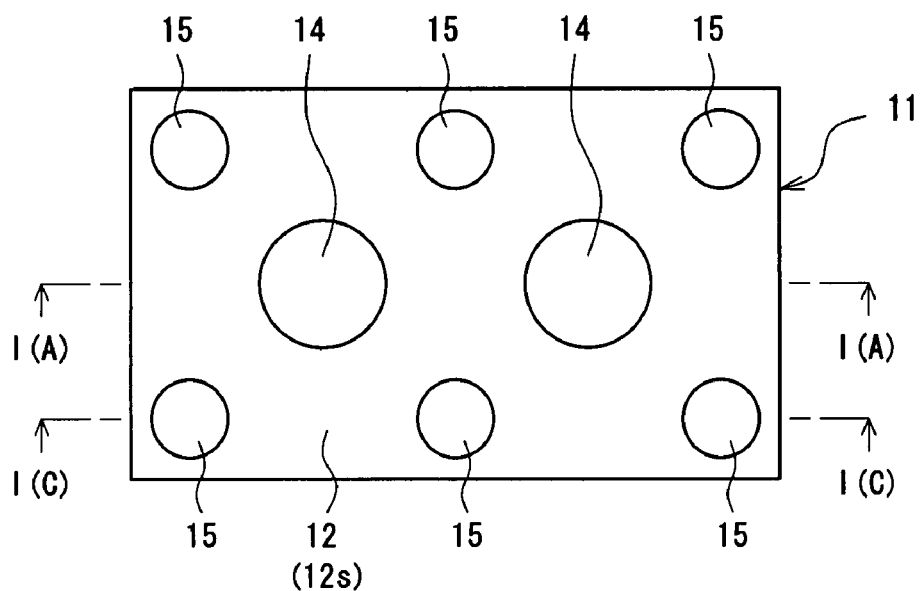
Figure 1C:
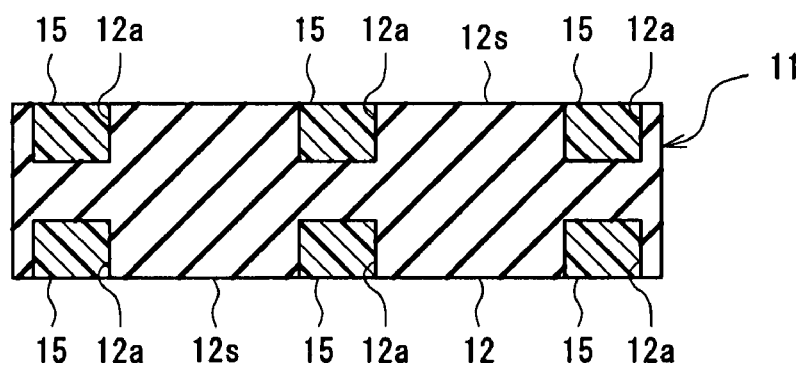

First Embodiment (FIG. 1): FIGS. 1(A) through 1(C) show an anisotropic conductive sheet (11) according to a first embodiment. FIG. 1(B) is a plan view (top view) of the anisotropic conductive sheet (11), FIG. 1(A) is a sectional view taken along the line I(A)-I(A) of FIG. 1(B), and FIG. 1(C) is a sectional view taken along the line I(C)-I(C) of FIG. 1(B). The anisotropic conductive sheet (11) has, in a base portion (12) formed of insulating silicone rubber, a plurality of (two in FIG. 1) conductive portions (13) composed of conductive particles connected together and extending therethrough in the thickness direction, with the portions of the conductive portions (13) exposed on the surfaces forming conductive contacts (14). Further, adhesive portions (15) are formed in a dotted fashion so as to be spaced apart from the conductive contacts (14) by the same distance. The adhesive portions (15) are formed by embedding an adhesive material in recesses (12a) provided in the surfaces (12s) in the thickness direction of the base portion (12), and the surfaces of the adhesive portions (15) are flush with the surfaces of the base portions (12) and the conductive contacts (14). The adhesive portions (15) are provided in both of the two surfaces (12s) in the thickness direction of the anisotropic conductive sheet (11).

Figure 2:
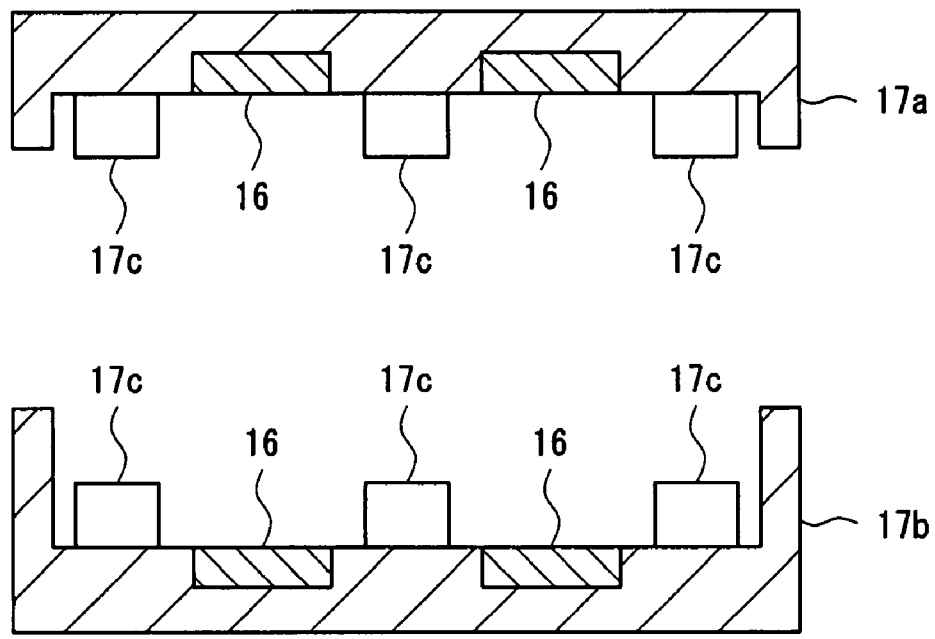
FIG. 2 is a sectional view of a die for manufacturing an anisotropic conductive sheet.
Figure 3:
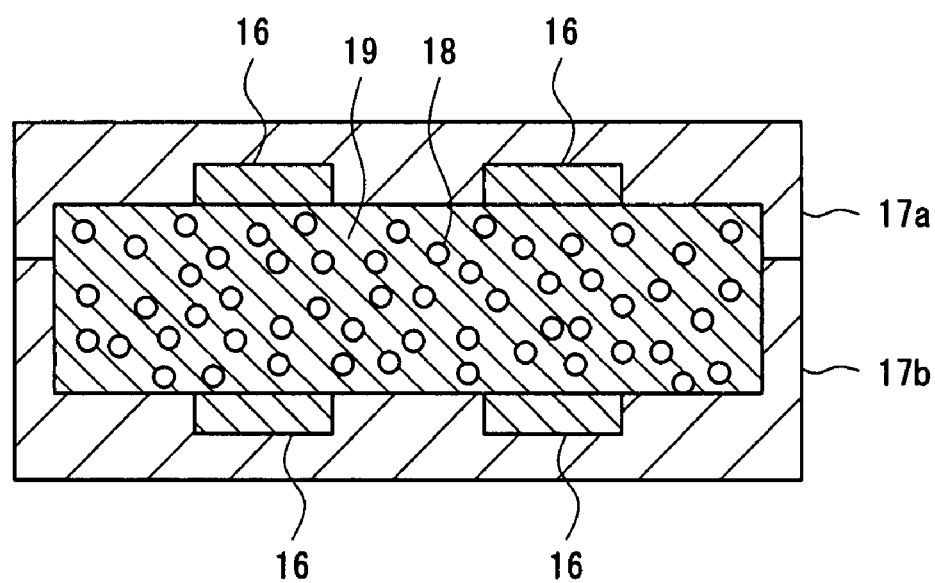
FIG. 3 is a sectional view of the die filled with liquid polymer in the anisotropic conductive sheet manufacturing process, showing the die in the state directly after filling with liquid polymer containing conductive particles.
Figure 4:
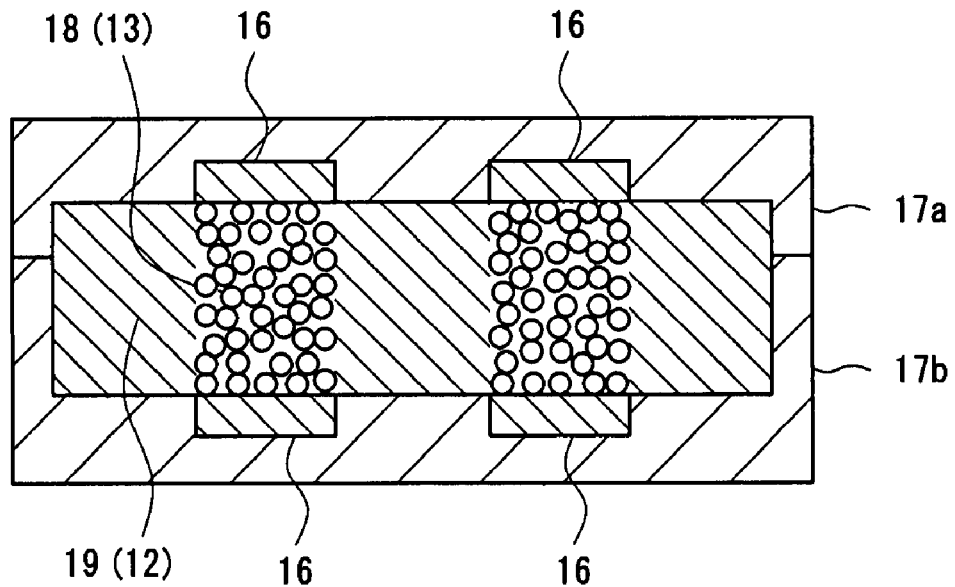
FIG. 4 is a sectional view of the die filled with liquid polymer in the anisotropic conductive polymer manufacturing process, showing how the conductive particles are oriented.
Figure 5:
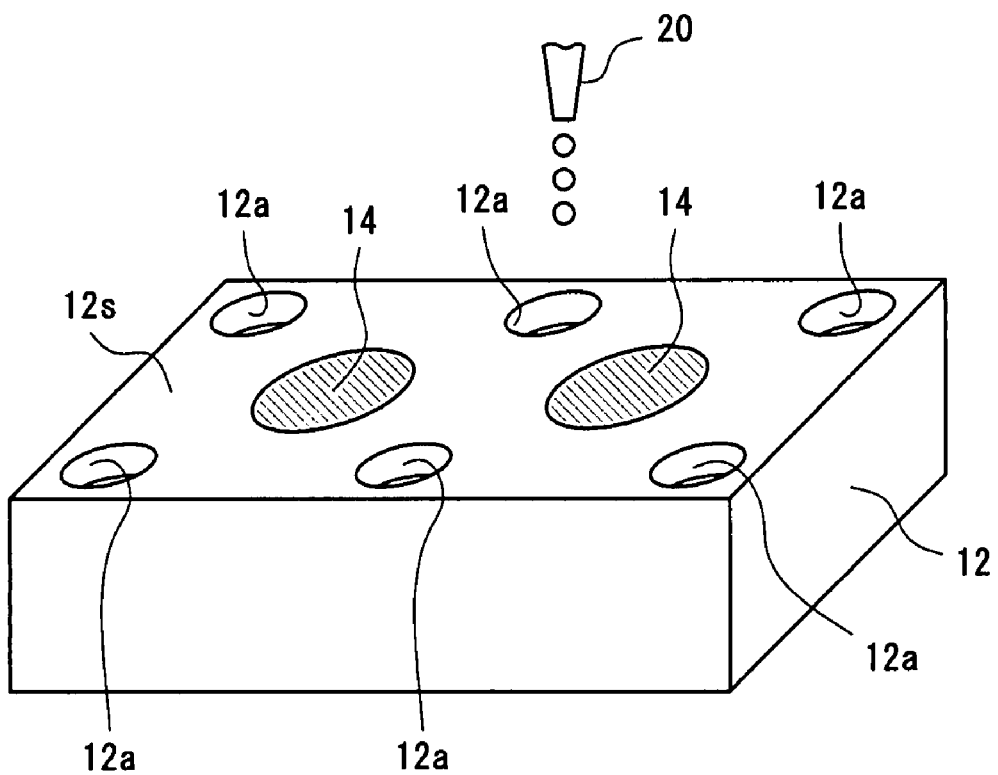
FIG. 5 is a perspective view of an anisotropic conductive sheet, illustrating how an adhesive material is applied in the anisotropic conductive sheet manufacturing process of the present invention.

FIGS. 2 through 5 schematically show the process of manufacturing the anisotropic conductive sheet (11). First, there are prepared a pair of upper and lower dies (17a and 17b) in which pins (16) formed of magnetic material are embedded. In the dies (17a and 17b), there are provided protrusions (17c) protruding into the cavity so as to form the recesses (12a) to be filled with adhesive material (FIG. 2). A liquid polymer (19) containing conductive particles (18) is poured into the die (17a, 17b) (FIG. 3), and the liquid polymer (19) is cured while orienting the conductive particles (18) in the extensions of the pins (16) by the magnetic force thereof. In this way, there are formed the conductive portions (13) composed of the conductive particles (18) oriented in the insulating base portion (12) formed of the liquid polymer (19) (FIG. 4). After releasing this molding from the die, an adhesive is applied to the recesses (12a) provided in the base portion (12) by means of a dispenser (20) or the like (FIG. 5), and the polymer is cured. In this way, the adhesive portions (15) are formed in the recesses (12a) to thereby obtain the anisotropic conductive sheet (11) as shown in FIGS. 1(A) through 1(C).

Of the die (17a, 17b), the pins (16) are formed of a magnetic material, whereas the portion other than the pins (16) are produced by using a non-magnetic material, such as aluminum, copper, tungsten carbide, brass, or resin. It is desirable for the magnitude of the magnetic force of the magnetic material used for the pins (16) to be 0.1 T (tesla) to 2 T. If the magnitude of the magnetic force is less than 0.1 T, the orientation of the conductive particles is not effected to a sufficient degree, and no uniform conductive portions (13) can be generated. On the other hand, if the magnitude of the magnetic force is more than 2 T, while it is possible to form uniform conductive portions (13), no positive effect is to be expected since the saturation magnetic flux density of a ferromagnetic material such as iron, is less than 2 T.

For the liquid polymer (19), there is used a material which is electrically insulating and which exhibits a rubber-like elasticity after curing. Examples of the material that can be used include silicone rubber, natural rubber, isoprene rubber, butadiene rubber, acrylonitrile butadiene rubber, 1,2-polybutadiene, styrene-butadiene rubber, chloroprene rubber, nitrile rubber, butyl rubber, ethylene-propylene rubber, chlorosulfone rubber, polyethylene rubber, acrylic rubber, epichlorohydrin rubber, fluorine rubber, urethane rubber, styrene type thermoplastic elastomer, olefin type thermoplastic elastomer, ester type thermoplastic elastomer, urethane type thermoplastic elastomer, amide type thermoplastic elastomer, vinyl chloride type thermoplastic elastomer, fluoride type thermoplastic elastomer, and ion crosslinking elastomer. From the viewpoint of moldability, electrical insulation property, and weathering performance, it is desirable to employ silicone rubber; especially, it is still more desirable to employ liquid silicone rubber. It is necessary for the viscosity of the liquid polymer to be one imparting fluidity to the contained conductive particles (18) according to the magnetic field; preferably, it ranges from 1 Pa·s to 250 Pa·s, and more preferably, it ranges from 10 Pa·s to 100 Pa·s.

The conductive particles (18) contained in the liquid polymer (19) is made of a magnetic material of low electrical resistance forming the conductive portions (13) by magnetic force; examples of the materials to be preferably used include ferromagnetic metals such as iron, nickel, or cobalt, or an alloy thereof, a material obtained by plating a resin or ceramic with a magnetic conductor, and a material obtained by plating magnetic powder with a highly conductive metal. However, when the conductive portions (13) are formed by a method other than a method based on orientation with magnetic force, the material to be used is not particularly limited to a magnetic one; in this case, it is possible to employ a metal of a low electrical resistance of preferably 1Ω or less, ceramic, carbon, etc. Examples of the highly conductive metal other than that mentioned above include metals such as gold, silver, platinum, aluminum, copper, palladium, and chromium, and an alloy such as stainless steel. Further, it is also possible to employ a material obtained by plating thin wires of a resin, ceramic or the like with a highly conductive metal. When orienting the conductive particles (18) in the liquid polymer by magnetic force, a granular material is used; however, in the case in which the conductive material is previously formed into the configuration of the conductive portions (13), it is also possible to use a fibrous or thin-wire-like material.

When orienting the conductive particles (18) in the liquid polymer (19), it is desirable for the content of the conductive particles (18) to be 5 to 100 parts by weight with respect to 100 parts by weight of the liquid polymer. If the content is less than 5 parts by weight, there is a fear of the conductive particles (18) not being connected together to a sufficient degree to allow them to extend through the cured liquid polymer (19), involving portions where no conductive portions (13) are formed. If the content exceeds 100 parts by weight, the viscosity becomes too high, and there is the possibility of the conductive particles (18) not being oriented to a sufficient degree. It is desirable for the conductive particles (18) to be spherical ones of uniform grain size. If they do not exhibit a sharp grain size distribution, there is a fear of the conductive portions (13) of the resultant anisotropic conductive sheet (11) involving branching or the configuration of the conductive portions (13) being rather irregular. In view of this, it is desirable for the standard deviation of the grain size distribution to be 20% or less. It is desirable for the average grain size of the conductive particles to range from 10 nm to 200 μm. If the average grain size is less than 10 nm, the viscosity of the liquid polymer (19) containing the conductive particles (18) increases, and the contact resistance of the resultant anisotropic conductive sheet (11) increases. If the average grain size is larger than 200 μm, the conductive particles (18) are liable to settle in the liquid polymer (19), resulting in a deterioration in dispersion property.

The curing conditions for curing the liquid polymer (19), such as the curing temperature and time, are determined as appropriate according to the liquid polymer (19) selected; it is desirable for the curing to be effected after the conductive particles (18) have been oriented to a sufficient degree in the magnetic field. Further, the liquid polymer (19) containing the conductive particles (18) may also contain, apart from the liquid polymer (19) and the conductive particles (18), various additives such as crosslinking accelerator and dispersing agent as long as they do not adversely affect the orientation property of the conductive particles (18), the stability of the liquid polymer (19), conductivity of the resultant anisotropic conductive sheet (11), etc.

Examples of the material of the adhesive portions (15), which are formed through application of an adhesive material, include a silicone type resin, a urethane type resin, an acrylic resin, an epoxy type resin, an ethylene-vinyl-acetate copolymer, an ethylene-acrylate copolymer, a polyamide type resin, a polyester type resin, a polyolefin type resin, a fluorine type resin, an ionomer type resin, a polystyrene type resin, a polyimide type resin, other thermoplastic resins and thermosetting resins, and an adhesive material formed of a mixture of two or more kinds of the above-mentioned materials. Above all, a silicone type adhesive material is preferable from the viewpoint of heat resistance, durability, and vibration characteristic. Further, it is possible for those adhesive materials to contain, as needed, additives such as curing agent, vulcanizing agent, softening agent, coloring agent, and filler.

While the thickness of the anisotropic conductive sheet (11) allows various modifications, from the viewpoint of a demand for a reduction in the thickness and size of apparatuses, it usually ranges from approximately 0.1 mm to 10 mm, and more preferably, from 0.2 mm to 2 mm. If the thickness is less than 0.1 mm, the anisotropic conductive sheet (11) cannot be endowed with a sufficient level of strength, and there is a fear of breakage during use. On the other hand, if the thickness exceeds 5 mm, the magnetic force is weakened in the intermediate portion in the thickness direction, so it may occur that the orientation of the conductive particles (18) is not effected to a sufficient degree. Further, the thickness of the apparatus will increase. The thickness of the adhesive portions (15) varies according to the thickness of the anisotropic conductive sheet (11) as a whole; while it may be 1/10 to 1/2 of the thickness of the anisotropic conductive sheet (11), it is usually 10 μm to 500 μm, and more preferably, 25 μm to 50 μm. There are no particular limitations regarding the width of the anisotropic conductive sheet (11), and it may vary as appropriate according to the size of the conductive portions of the object of attachment; the diameter of one dot may range from 0.05 mm to 3.0 mm, and more preferably, from 0.2 mm to 1.0 mm.

The die (17a, 17b) used for the production of the anisotropic conductive sheet (11) may employ, instead of the ferromagnetic pins (16), the paramagnetic pins (16), generating a magnetic field in the cavity inside the die (17a, 17b) by an electromagnet installed outside the die (17a, 17b). Pouring the liquid polymer (19) containing the conductive particles (18) into the die (17a, 17b) to which magnetic force is imparted, is advantageous in that the orientation time for the conductive particles (18) is short. On the other hand, it must be cared so that a variation is not generated in the amount and density of the particles forming the conductive portions (13).

In the anisotropic conductive sheet (11) thus obtained, the adhesive portions (15) are provided at positions where they do not come into contact with the portions where the conductive contacts (14) are exposed and are spaced apart therefrom, so even when the anisotropic conductive sheet (11) is mounted and pressurized, there is no fear of the adhesive material being squeezed out to cover the conductive portions (13). Thus, no faulty conduction occurs. Further, since the surface of the conductive contacts (14) and the surfaces of the adhesive portions (15) are flush with each other, it is possible to bring the anisotropic conductive sheet (11) into uniform contact with the object of attachment.

Further, since the adhesive portions (15) are embedded in the base portion (12), it is possible to prevent the adhesive material from being spread even if pressurized. Further, the adhesive material is not easily separated from the base portion (12), making it possible to prevent transfer of the adhesive material to the object of attachment.

Figure 6A:
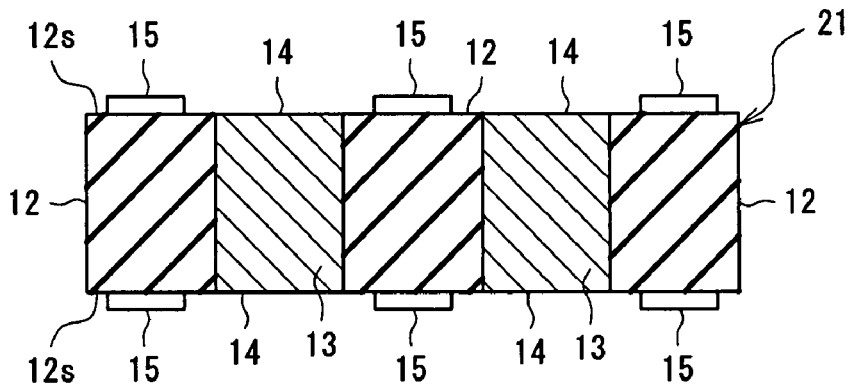
Figure 6B:
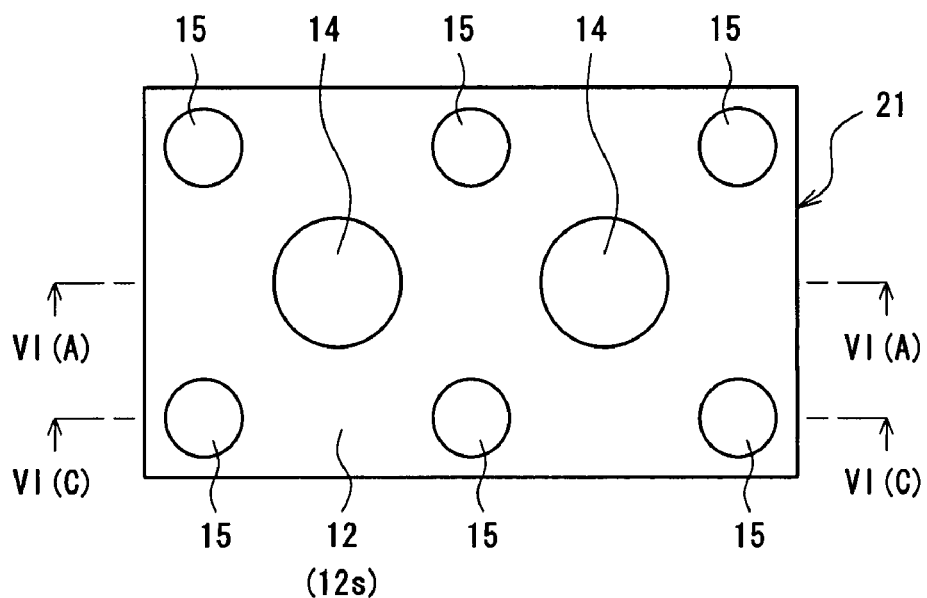
Figure 6C:
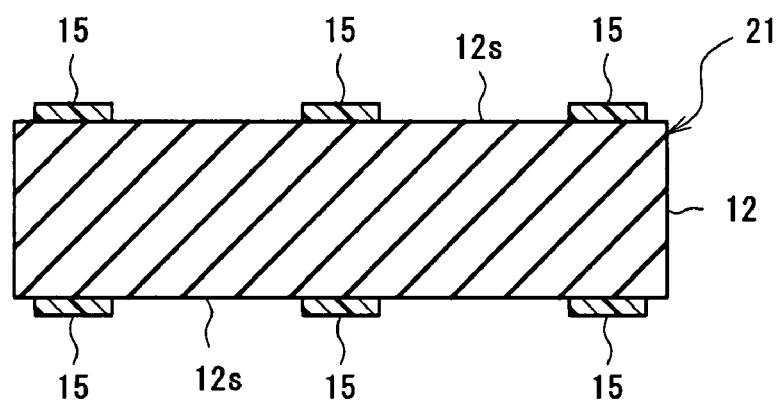

Second Embodiment (FIG. 6): FIGS. 6(A) through 6(C) show an anisotropic conductive sheet (21) according to a second embodiment. As shown in FIG. 6(B), the anisotropic conductive sheet (21) is the same as the anisotropic conductive sheet (11) of the first embodiment in that the adhesive portions (15) are formed in a dotted fashion. While in the anisotropic conductive sheet (11) the adhesive material is embedded in the recesses (12a) provided in the base portion (12), in this embodiment, no recesses are formed in the base portion (12) as shown in FIG. 6(C); instead, the adhesive portions (15) are formed through application to the flat surfaces (12s). Thus, the surfaces of the adhesive portions (15) protrude somewhat from the surfaces (12s) of the base portion (12). To produce the anisotropic conductive sheet (21), a die (not shown) having no protrusions for forming the recesses is used.

In the anisotropic conductive sheet (21), the adhesive portions (15) protrude beyond the conductive contacts (14), so the fixation to the object of attachment can be effected reliably. In forming the adhesive portions (15), it is desirable to adopt, apart from a dispenser, a printing method such as silk screen printing, pad printing, or metal block printing. It is also possible to previously provide on a base member a pattern formed of the adhesive material forming the adhesive portions (15), and to transfer the adhesive material onto the anisotropic conductive sheet (21), thereby providing the adhesive portions (15). In this embodiment, the adhesive portions (15) are provided on the flat surfaces (12s) of the base portion, so it is possible to adjust the thickness of the adhesive portions (15) as appropriate, with the thickness thereof being 5 μm to 1 mm.

Figure 7A:
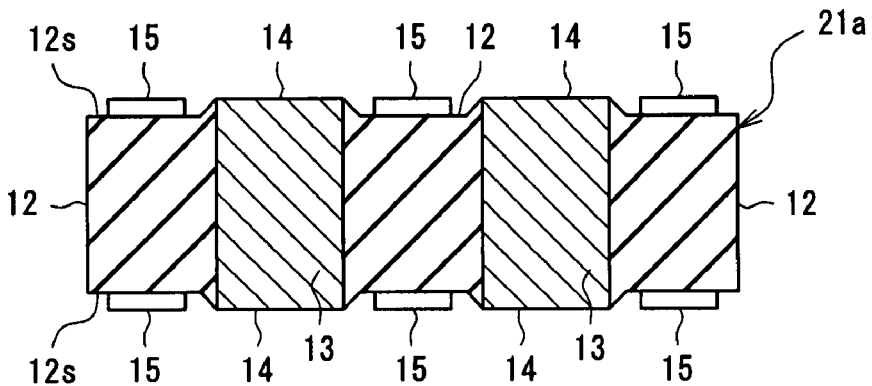
Figure 7B:
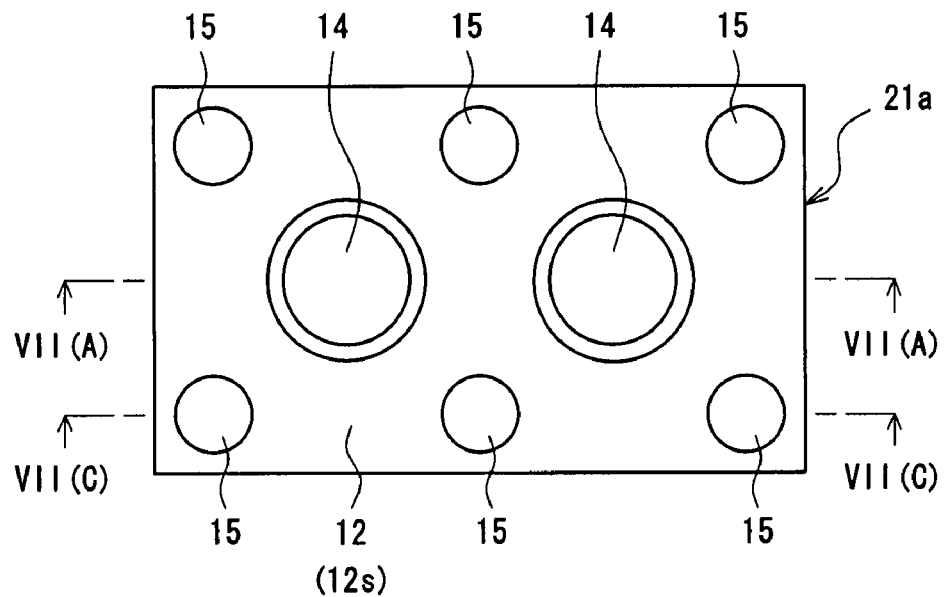
Figure 7C:
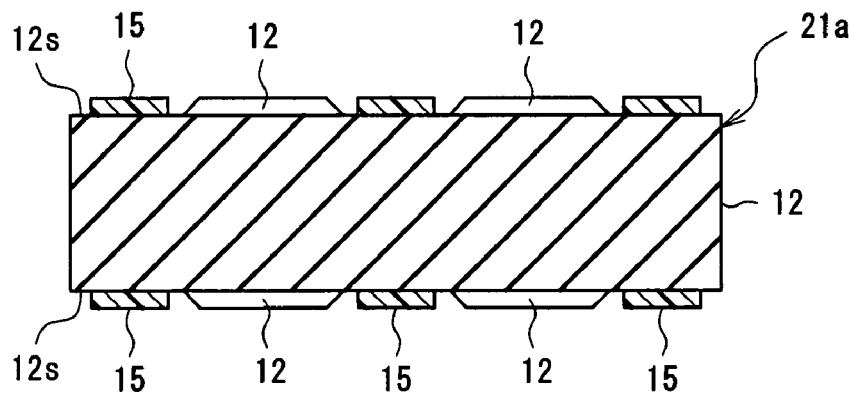

First Modification of the Second Embodiment (FIG. 7): FIGS. 7(A) through 7(C) show an anisotropic conductive sheet (21a) according to a first modification of the second embodiment. As compared with the anisotropic conductive sheet (21), in the anisotropic conductive sheet (21a), the conductive portions (13) and the portions of the base portion (12) around the same protrude somewhat and are swollen. Thus, the surfaces of the conductive contacts (14) protrude beyond the surfaces (12s) of the base portion (12). Thus, it is possible to reliably effect conduction between the anisotropic conductive sheet (21a) and the object of attachment. The conductive portions (15) are formed on the flat surfaces (12s) of the base portion (12). By adjusting the application amount of the adhesive material, it is possible to form the surfaces of the adhesive portions (15) so as to be flush with the surfaces of the conductive contacts (14); further, by increasing the application amount of the adhesive material, it is possible to form the surfaces of the adhesive portions (15) so as to protrude beyond the surfaces of the conductive contacts (14). In the anisotropic conductive sheet (21a) of the first modification, the surfaces of the conductive contacts (14) and the surfaces of the adhesive portions (15) are flush with each other, so it is possible to bring the anisotropic conductive sheet (21a) into uniform contact with the object of attachment. When the adhesive portions (15) protrude beyond the conductive contacts (14), it is possible to more reliably effect the fixation of the anisotropic conductive sheet to the object of attachment. In this way, even if the adhesive portions (15) protrude beyond the conductive contacts (14), since the adhesive material is soft, it is possible to sufficiently secure contact between the conductive contacts (14) and the object of attachment.

Further, the adhesive portions (15) are provided on the surfaces (12s) of the base portion (12) recessed from the surfaces of the conductive contacts (14), so if the adhesive material forming the adhesive portions (15) is pressed and spread through pressurization, it is not spread onto the conductive contacts (14), which are swollen high. Thus, it is possible to secure reliable conduction of the conductive contacts (14).

Figure 8A:
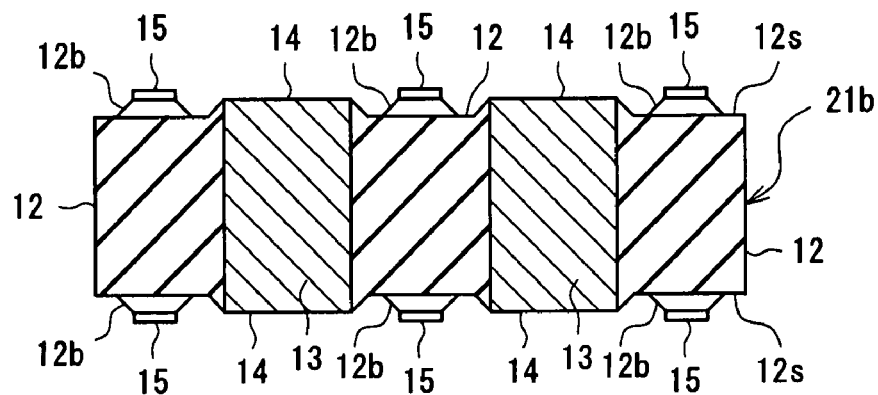
Figure 8B:
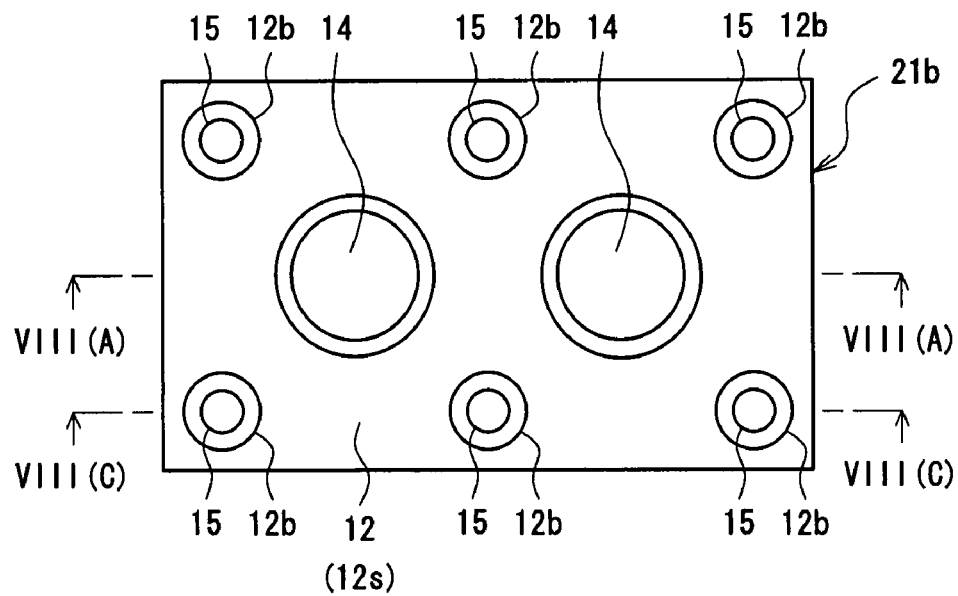
Figure 8C:
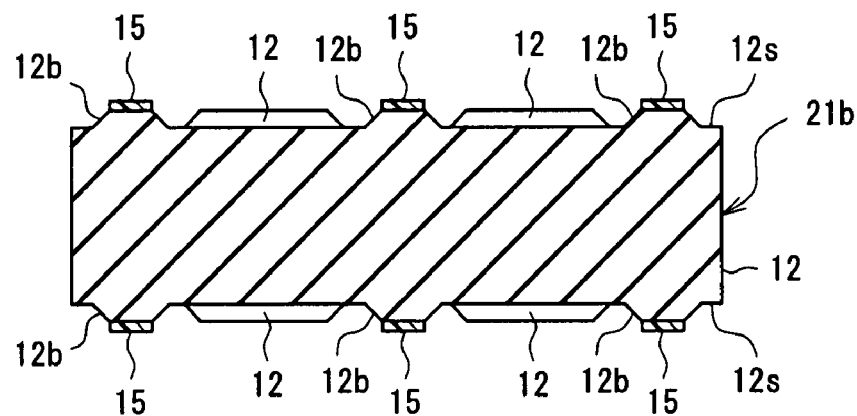

Second Modification of the Second Embodiment (FIG. 8): FIGS. 8(A) through 8(C) show an anisotropic conductive sheet (21b) according to a second modification of the second embodiment, in which protrusions (12b) are provided on the base portion (12) so as to cover the difference in height between the swollen conductive contacts (14) and the flat base portion (12), and the adhesive portions (15) are provided on the protrusions (12b). That is, the height of the protrusions (12b) is substantially the same as the height of the conductive contacts (14). By providing the adhesive portions (15) on the protrusions (12b), the adhesive portions (15) become higher than the conductive contacts (14), and protrude outwardly, so the adhesive portions (15) are reliably brought into contact with the object of attachment. Thus, it is possible to temporarily fix the anisotropic conductive sheet (21b) to the object of attachment without pressurizing the anisotropic conductive sheet (21b). Further, since the base portion (12) has the protrusions (12*b*), the anisotropic conductive sheet (21*b*) can be deflected greatly with lower pressure, making it possible to stabilize the contact with the object of attachment even through pressurization with low pressure. While in FIG. 8 the protrusions (12*b*) have a truncated-cone-shaped configuration, they may also be formed in other configurations such as a columnar one.

Figure 9A:
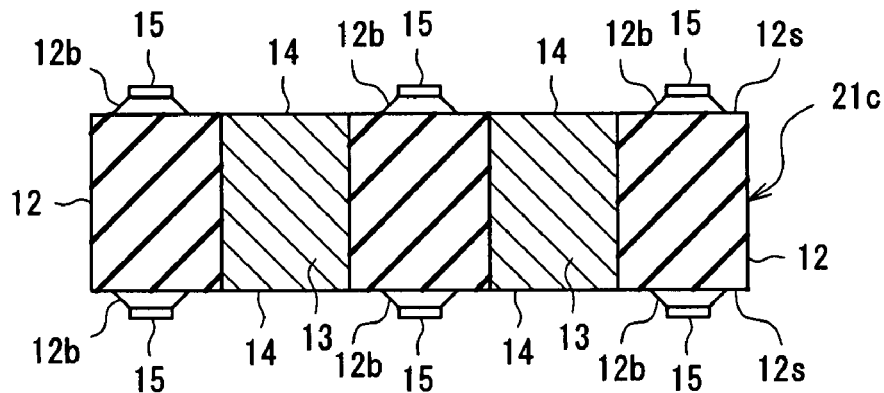
Figure 9B:
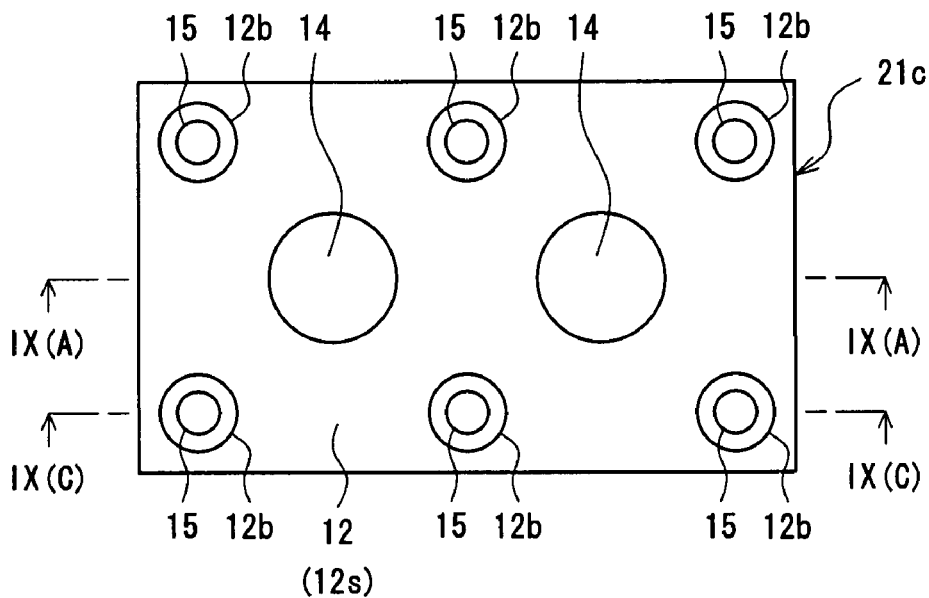
Figure 9C:
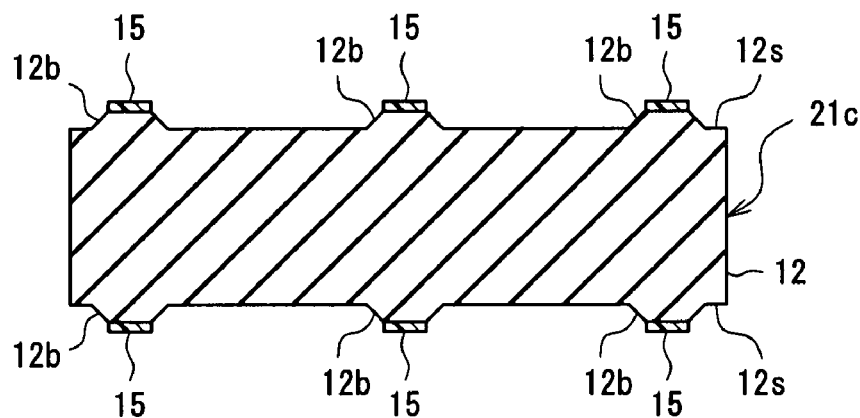

Third Modification of the Second Embodiment (FIG. 9): FIGS. 9(A) through 9(C) show an anisotropic conductive sheet (21*c*) according to a third modification of the second embodiment, which, while having, like the anisotropic conductive sheet (21*b*), the protrusions (12*b*), which are swollen portions of the base portion (12), has no swelling of the conductive contacts (14), with the surfaces (12*s*) of the base portion (12) being flush with the surfaces of the conductive contacts (14). In the anisotropic conductive sheet (21*c*), the adhesive portions (15) are provided on the protrusions (12*b*), whereby the adhesive portions (15) are higher than the conductive contacts (14) and protrude outwardly, so it is possible to reliably bring the adhesive portions (15) into contact with the object of attachment. Further, since the base portion (12) has the protrusions (12*b*), the anisotropic conductive sheet (21*c*) can be deflected greatly with low pressure, and the conductive contacts (14) can be brought into stable contact with the object of attachment even through pressurization with low pressure. While in FIGS. 9(A) through 9(C) the protrusions (12*b*) have a truncated-cone-shaped configuration, they may also be formed in some other configuration such as a columnar one. In this modification, the conductive portions (13) and the peripheral portions thereof do not protrude; however, if the adhesive material is pressed and spread through pressurization, the spread adhesive material covers the protrusions (12*b*) and does not reach the conductive contacts (14), so it is possible to secure stable conduction.

Figure 10A:
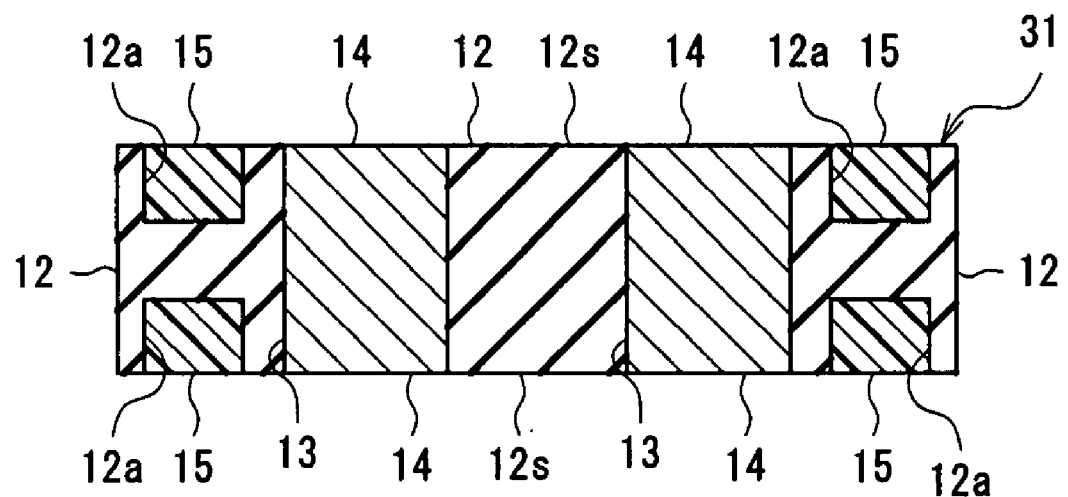
Figure 10B:
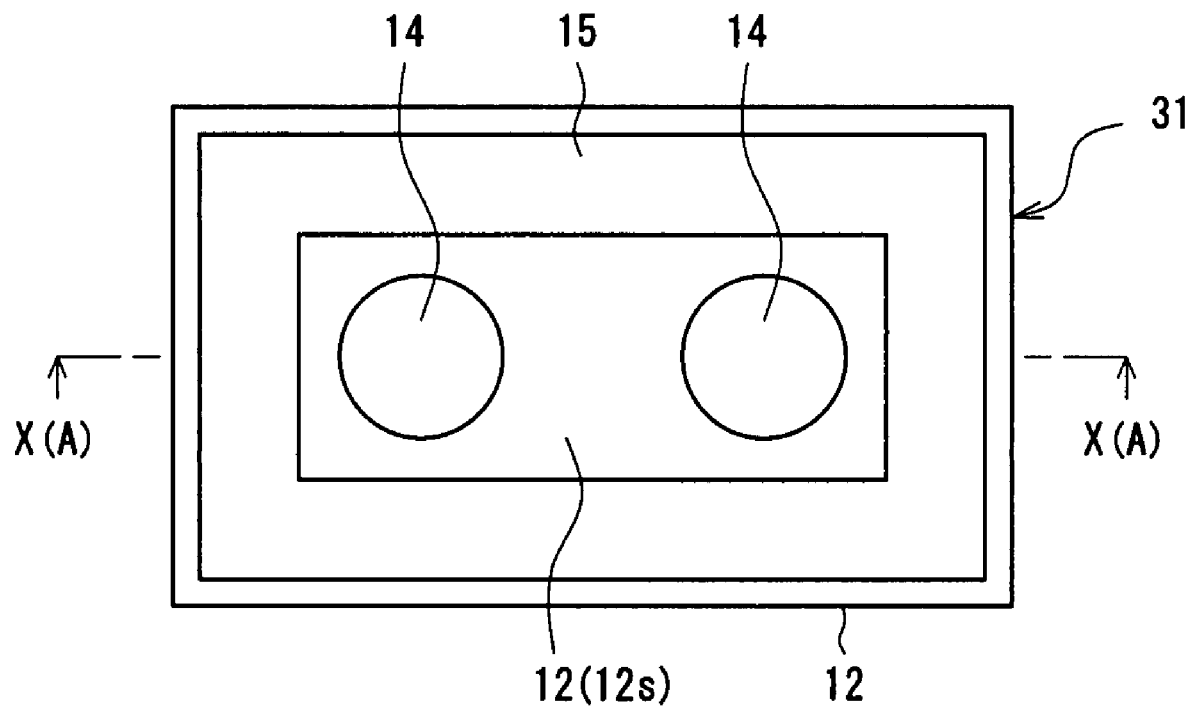

Third Embodiment (FIG. 10): FIGS. 10(A) and 10(B) show an anisotropic conductive sheet (31) according to a third embodiment. FIG. 10(B) is a plan view (top view) of the anisotropic conductive sheet (31), and FIG. 10(A) is a sectional view taken along the line X(A)-X(A) of FIG. 10(B). The anisotropic conductive sheet (31) has on its surfaces the adhesive portions (15) provided in a linear fashion. Unlike the anisotropic conductive sheet (11) formed in the dotted fashion of the first embodiment, the adhesive portions (15) are formed in a linear fashion. However, the anisotropic conductive sheet (31) of the third embodiment is the same as the anisotropic conductive sheet (11) of the first embodiment in that the recesses (12*a*) are formed in the base portion (12) and filled with the adhesive material. Thus, the surfaces of the adhesive portions (15) are formed so as to be flush with the surfaces of the conductive contacts (14).

In the anisotropic conductive sheet (31), the adhesive portions (15) are provided so as to be spaced apart from the conductive contacts (14), so even if it is pressurized at the time of mounting, there is no fear of the adhesive material being squeezed out to cover the conductive portions (13). Thus, no faulty conduction occurs. Further, since the surfaces of the conductive contacts (14) and the surfaces of the adhesive portions (15) are flush with each other, it is possible to bring the anisotropic conductive sheet (31) into uniform contact with the object of attachment. Further, since the adhesive portions (15) are embedded in the base portion (12), the adhesive material is not easily separated from the base portion (12), making it possible to prevent transfer of the adhesive material to the object of attachment.

Further, in the anisotropic conductive sheet (31), the adhesive portions (15) are provided continuously in a loop-like fashion around the conductive contacts (14), so it is possible to bring the anisotropic conductive sheet into stable contact with the object of attachment regardless of the configuration of the object of attachment. Since the loop-like adhesive portion (15) is held in contact with the object of attachment, the interior surrounded by the adhesive portion (15) is kept in a decompressed state, thereby making the anisotropic conductive sheet (31) still less subject to separation.

Figure 11A:
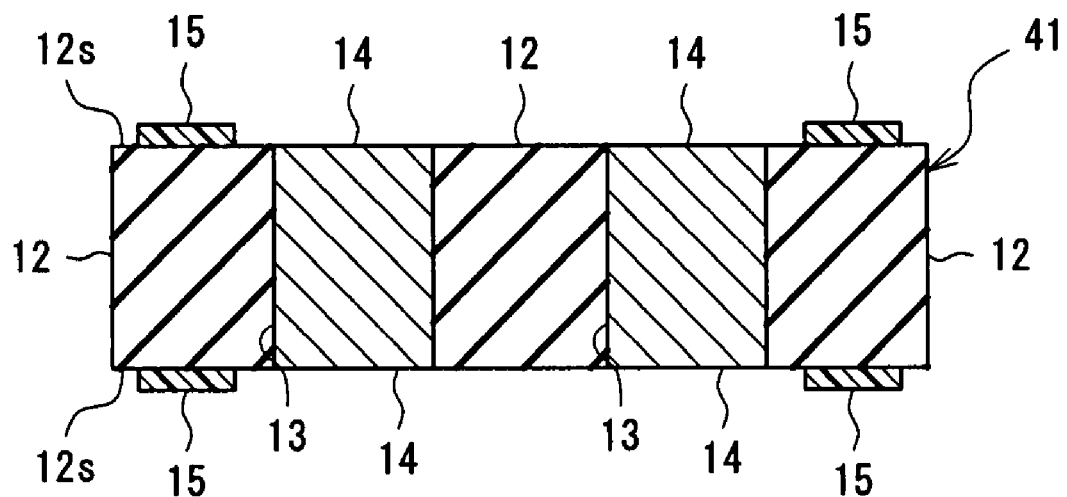
Figure 11B:
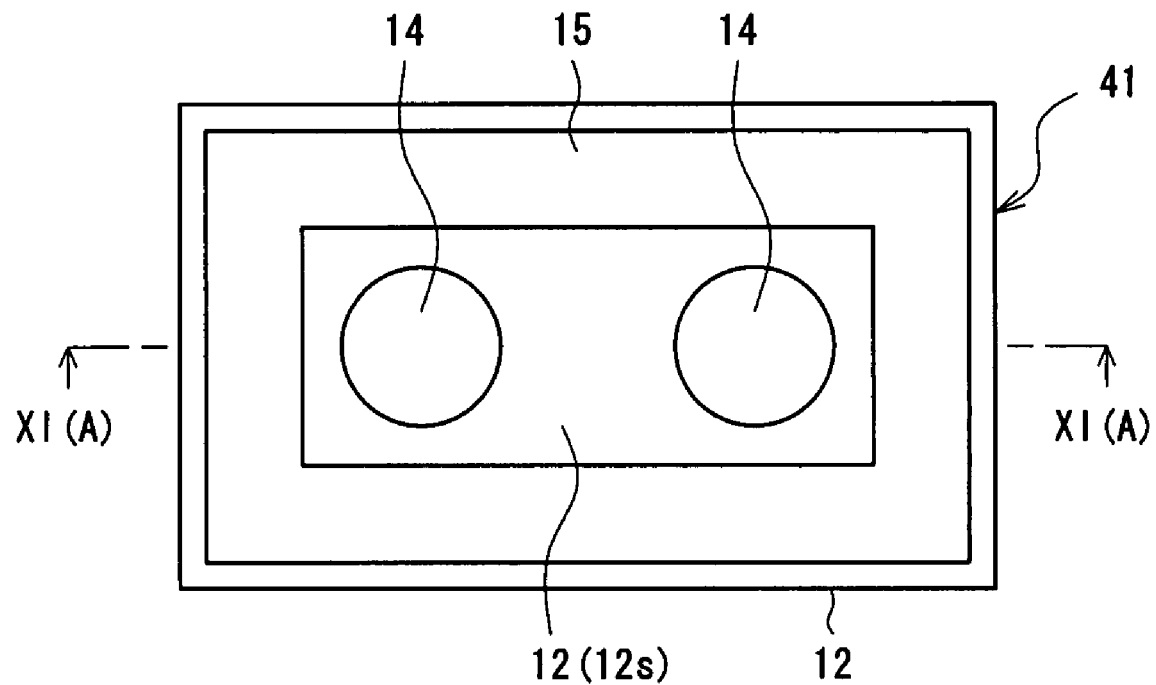

Fourth Embodiment (FIG. 11): An anisotropic conductive sheet (41) according to this embodiment shown in FIGS. 11(A) and 11(B) is the same as the anisotropic conductive sheet (31) of the third embodiment in that the adhesive portion (15) is formed in a linear fashion. While in the anisotropic conductive sheet (31) of the third embodiment the adhesive material is embedded in the recesses (12*a*) formed in the base portion (12), in this embodiment, no recesses are formed in the base portion (12); the adhesive portions (15) are formed by applying the adhesive material to the flat surfaces (12*s*) of the base portion (12). Thus, the surfaces of the adhesive portions (15) protrude beyond the surfaces (12*s*) of the base portion (12) by the thickness of the adhesive portions (15).

In the anisotropic conductive sheet (41) of this embodiment, the adhesive portions (15) are provided so as to be spaced apart from the portions where the conductive contacts (14) are exposed, so even when the anisotropic conductive sheet (41) is mounted and pressurized, there is no fear of the adhesive material being squeezed out to cover the conductive portions (13). Thus, no faulty conduction occurs. Further, in the anisotropic conductive sheet (41), the adhesive portions (15) protrude beyond the conductive contacts (14), so the anisotropic conductive sheet can be reliably fixed to the object of attachment.

Figure 12A:
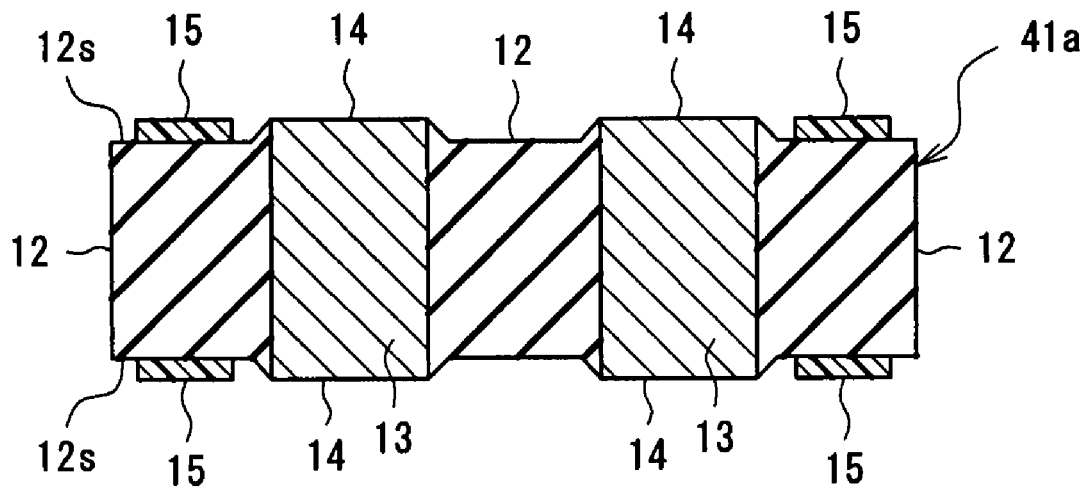
Figure 12B:
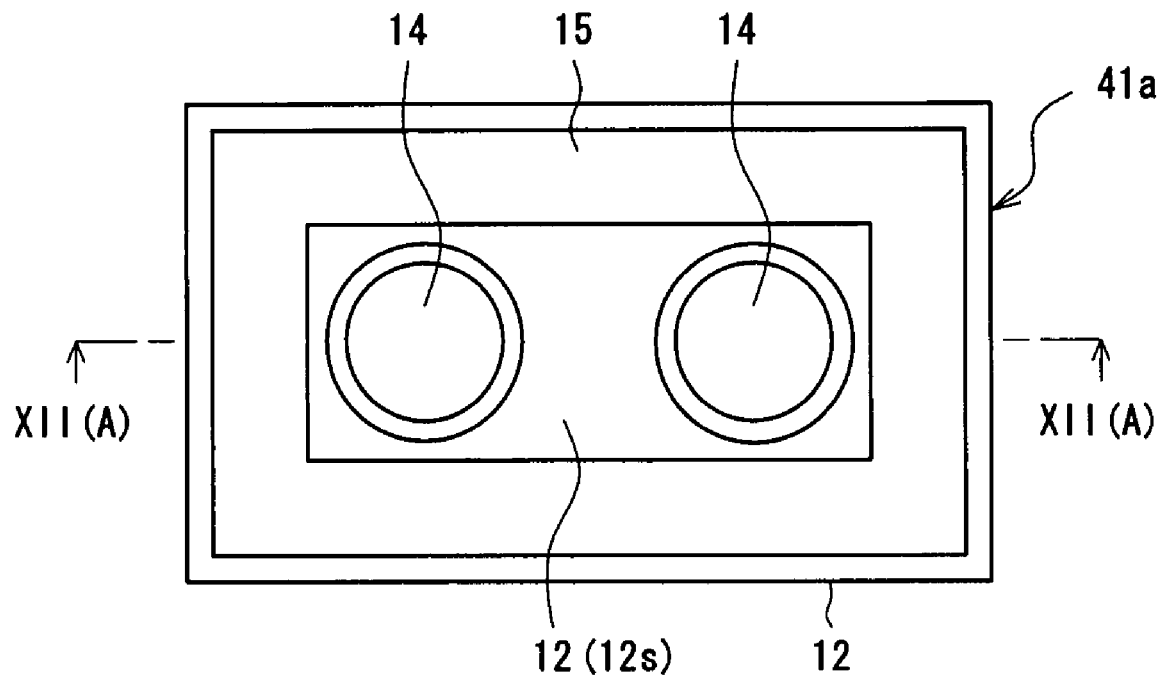

First Modification of the Fourth Embodiment (FIG. 12): FIGS. 12(A) and 12(B) show an anisotropic conductive sheet (41*a*) according to a first modification of the fourth embodiment. As compared with the anisotropic conductive sheet (41), the anisotropic conductive sheet (41*a*) is configured such that the conductive portions (14) and the portions of the base (12) therearound are somewhat swollen. Thus, the surfaces of the conductive contacts (14) protrude beyond the surfaces (12*s*) of the base portion (12). Due to the protrusion of the conductive contacts (14), it is possible to achieve reliable conduction with the object of attachment. Further, the adhesive portions (15) of the anisotropic conductive sheet (41*a*) are formed on the flat surfaces (12*s*) of the base portion (12). By adjusting the application amount of the adhesive material, it is possible to form the surfaces of the adhesive portions (15) so as to be flush with the surfaces of the conductive contacts (14); further, by increasing the application amount of the adhesive material, it is possible to cause the surfaces of the adhesive portions (15) to protrude beyond the surfaces of the conductive contacts (14). In the anisotropic conductive sheet (41*a*) of the first modification, the surfaces of the conductive contacts (14) and the surfaces of the adhesive portions (15) are flush with each other, so it is possible to bring the anisotropic conductive sheet (41*a*) into uniform contact with the object of attachment. On the other hand, when the adhesive portions (15) protrude beyond the conductive contacts (14), it is possible to more reliably fix the conductive contacts (14) to the object of attachment. In this way, even if the adhesive portions (15) protrude beyond the conductive contacts (14), since the adhesive material is soft, it is possible to sufficiently secure contact between the conductive contacts (14) and the object of attachment.

Further, the adhesive portions (15) are provided on the surfaces (12*s*) of the base portion (12) recessed from the surfaces of the conductive contacts (14), so if the adhesive material forming the adhesive portions (15) is pressed and spread through pressurization, it is not spread onto the conductive contacts (14), which are swollen high. Thus, it is possible to secure reliable conduction for the conductive contacts (14).

Figure 13A:
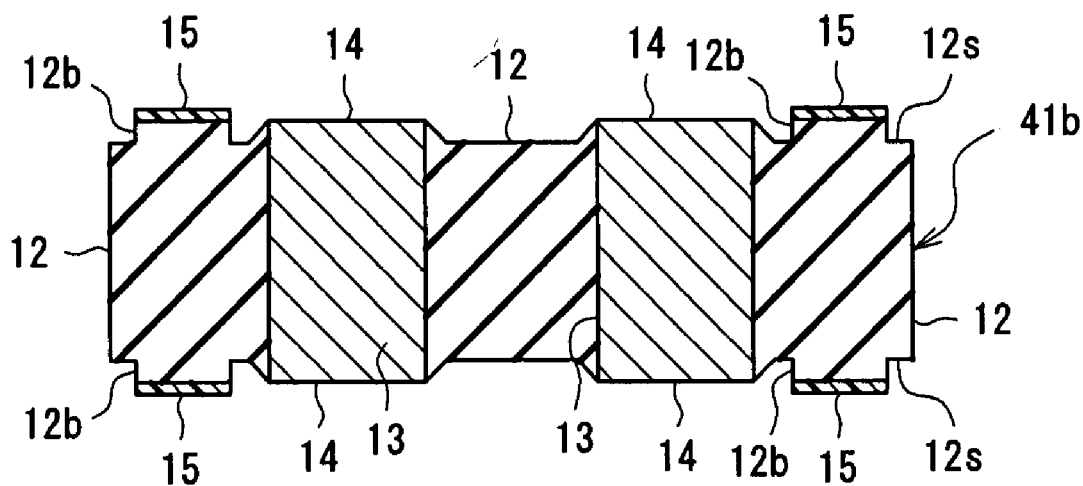
Figure 13B:
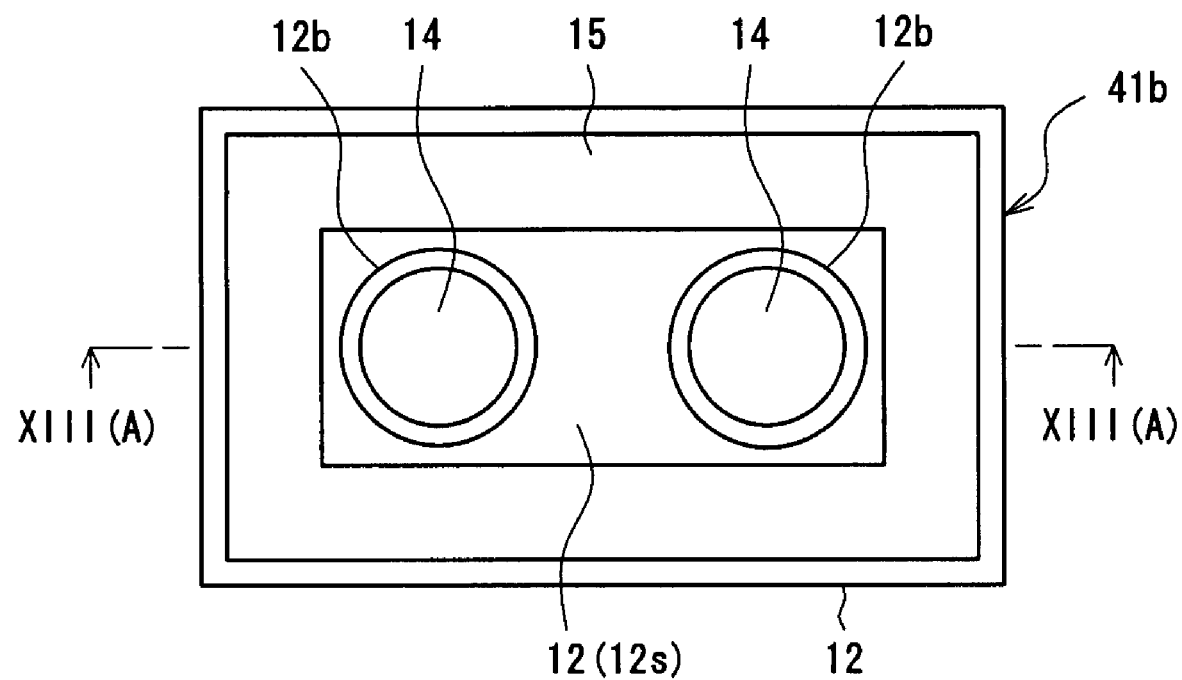

Second Modification of the Fourth Embodiment (FIG. 13): FIGS. 13(A) and 13(B) show an anisotropic conductive sheet (41b) according to a second modification of this embodiment, in which protrusions (12b) are provided on the base portion (12) so as to cover the difference in height between the swollen conductive contacts (14) and the flat base portion (12), and the adhesive portions (15) are provided on the protrusions (12b). That is, the height of the protrusions (12b) is substantially the same as the height of the conductive contacts (14). Due to the provision of the adhesive portions (15) on the protrusions (12b), the adhesive portions (15) are higher than the conductive contacts (14) and protrude outwardly, so the adhesive portions (15) are reliably brought into contact with the object of attachment. Thus, it is possible to temporarily fix the anisotropic conductive sheet (41b) to the object of attachment without having to pressurize the same. Further, since the base portion (12) has the protrusions (12b), it is possible to greatly deflect the anisotropic conductive sheet (41b) with low pressure, and the conductive contacts (14) can be brought into stable contact with the object of attachment through pressurization with low pressure. While the protrusions (12b) in FIG. 12(A) have a columnar configuration, they may also have some other configuration such as a truncated-cone-like one.

Figure 14A:
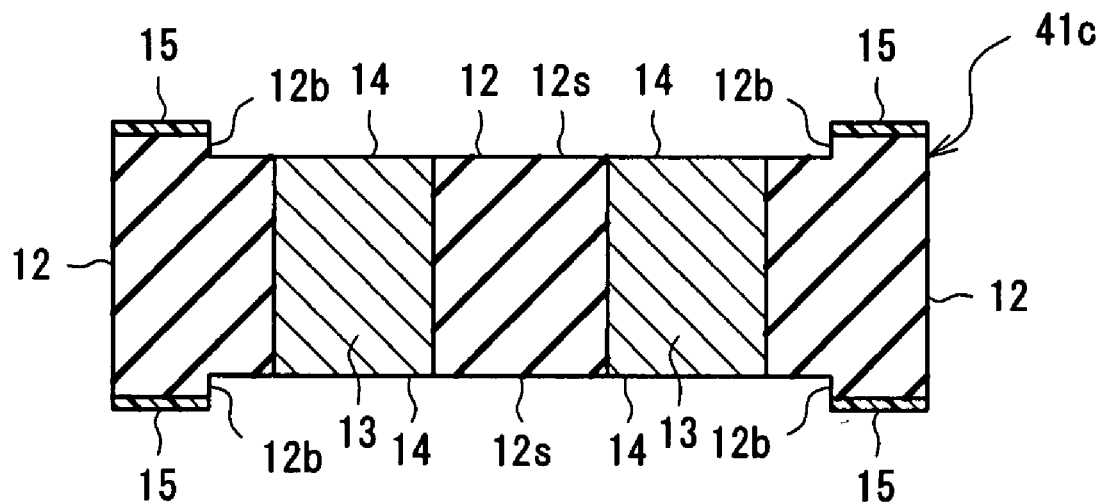
Figure 14B:
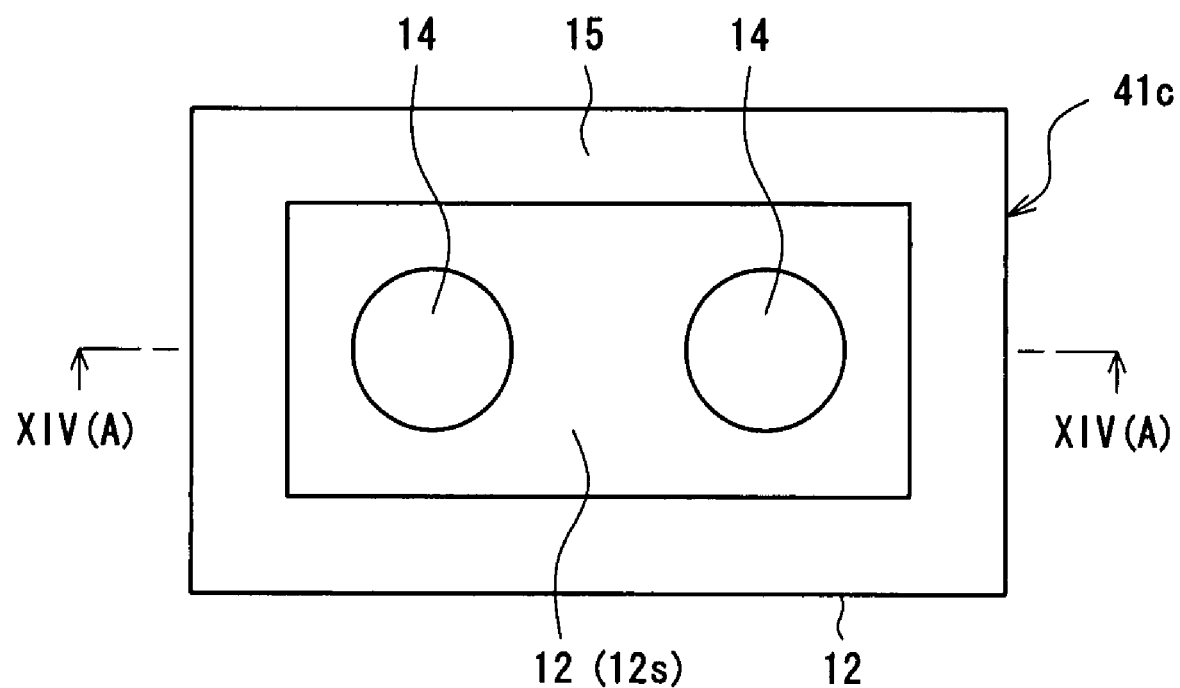

Third Modification of the Fourth Embodiment (FIG. 14): FIGS. 14(A) and 14(B) show an anisotropic conductive sheet (41c) according to a third modification of this embodiment, which, while having the protrusions (12b) which are formed through swelling of the base portions (12) as in the case of the anisotropic conductive sheet (41b), has no swelling of the conductive contacts (14), and the surfaces (12s) of the base portion (12) and the surfaces of the conductive contacts (14) are flush with each other. In the anisotropic conductive sheet (41c), by providing the adhesive portions (15) on the protrusions (12b), the adhesive portions (15) are higher than the conductive contacts (14) by the sum of the height of the protrusions (12b) and the height of the adhesive portions (15), and protrude outwardly, so it is possible to reliably bring the contact portions (15) into contact with the object of attachment. Further, since the base portion (12) has the protrusions (12b), it is possible to greatly deflect the anisotropic conductive sheet (41c) with low pressure, and to achieve stable contact between the conductive contacts (14) and the object of attachment through pressurization with low pressure.

Further, the adhesive portions (15) of the anisotropic conductive sheet (41c) are swollen along the outer periphery of the anisotropic conductive sheet (41c), so nails or the like do not easily get between the object of attachment and the anisotropic conductive sheet (41c); thus, once mounted, the anisotropic conductive sheet is not easily separated.

Figure 15A:
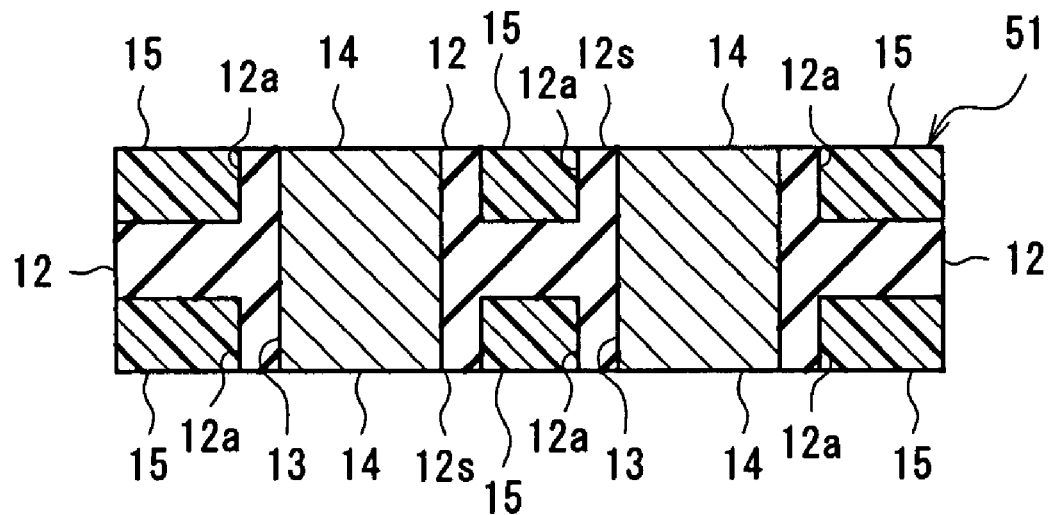
Figure 15B:
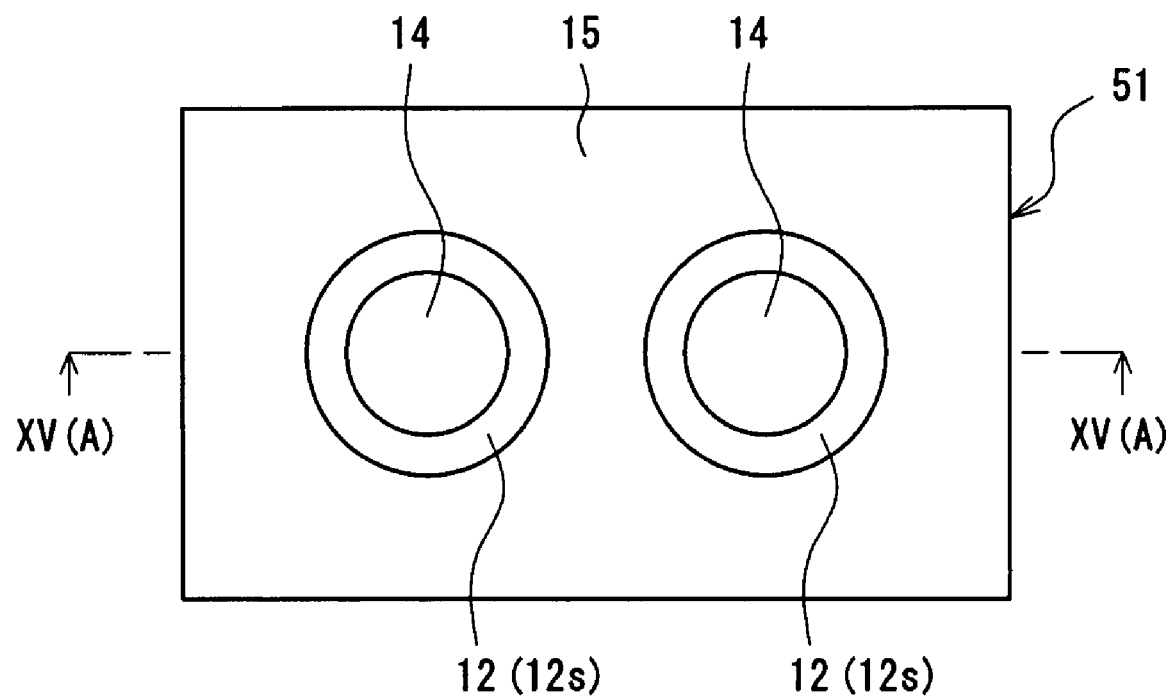

Fifth Embodiment (FIG. 5): FIGS. 15(A) and 15(B) show an anisotropic conductive sheet (51) according to a fifth embodiment. FIG. 15(B) is a plan view (top view) of the anisotropic conductive sheet (51), and FIG. 15(A) is a sectional view taken along the line XV(A)-XV(A) of FIG. 15(B). The anisotropic conductive sheet (51) has, on the entire both surfaces in the thickness direction thereof, the adhesive portions (15) except for regions separating the contact electrodes (14) from the adhesive portions (15) by a fixed distance. The anisotropic conductive sheet (51) is the same as the anisotropic conductive sheet (11) and the anisotropic conductive sheet (31) in that the adhesive material fills the recesses (12a) provided in the base portion (12), and the surfaces of the adhesive portions (15) are flush with the surfaces of the conductive contacts (14).

In the anisotropic conductive sheet (51) of this embodiment, the adhesive portions (15) are formed over the entire surfaces except for the regions separating them from the conductive contacts (14) by a fixed distance, so it is possible for the anisotropic conductive sheet to be bonded to the object of attachment more firmly. Further, since the adhesive portions (15) extend to the outer periphery of the anisotropic conductive sheet (51), the mounting can be effected in a stable manner even if there are some protrusions and recesses in the boundary portion between the anisotropic conductive sheet (51) and the object of attachment.

Figure 16:
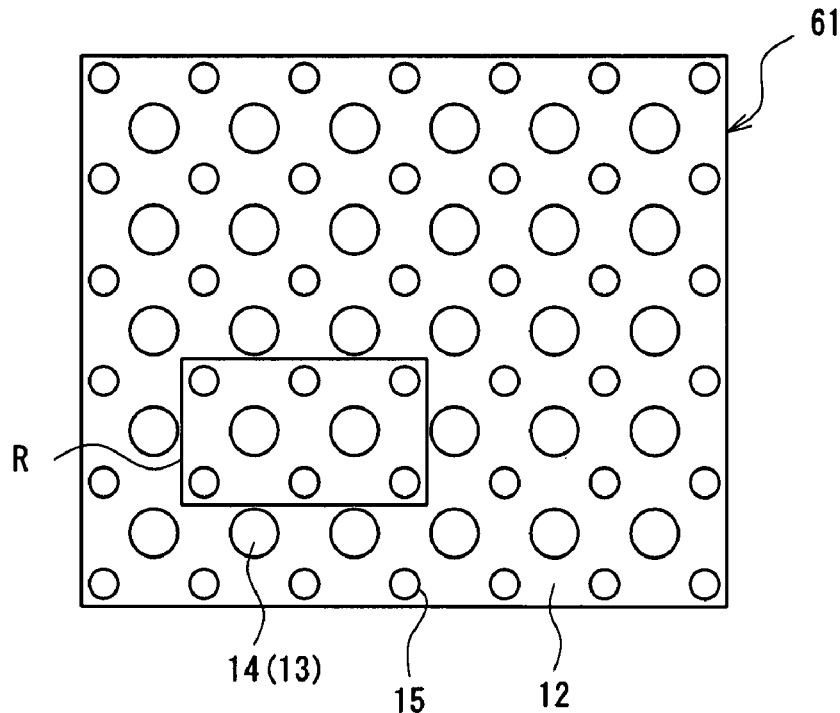
FIG. 16 is a plan view of an anisotropic conductive sheet according to a modification of the present invention.
Figure 17:
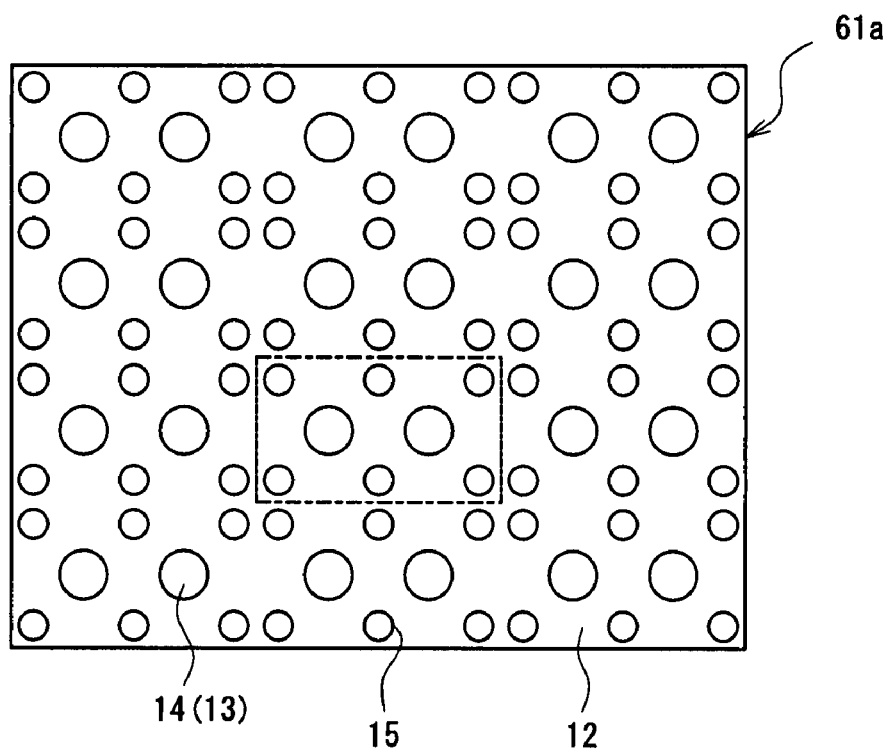
FIG. 17 is a plan view of an anisotropic conductive sheet according to another modification of the present invention.
Figure 18:
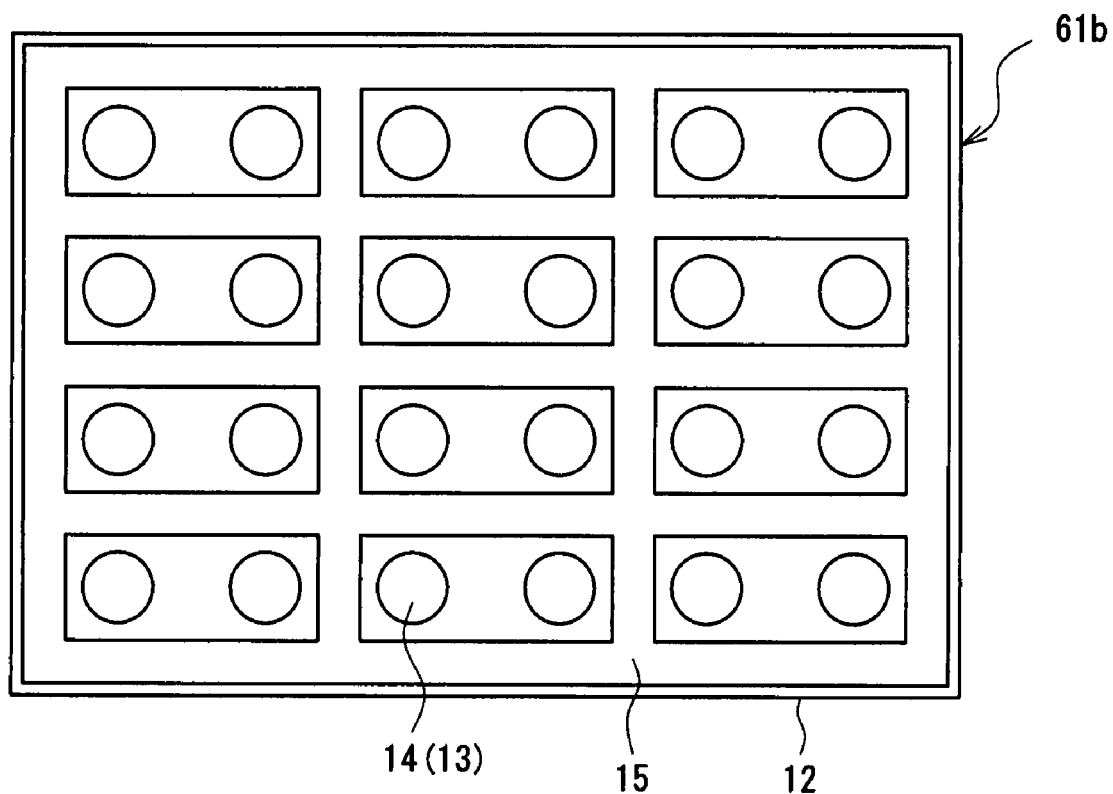
FIG. 18 is a plan view of an anisotropic conductive sheet according to still another modification of the present invention.

Modifications of the Embodiments (FIGS. 16 through 18): While in the anisotropic conductive sheet of each of the above-mentioned embodiments (11, 21, 21a, 21b, 21c, 31, 41, 41a, 41b, 41c, 51) two conductive portions (13) are formed, the number of the conductive portions (13) is not restricted to two. For example, it is also possible to form an anisotropic conductive sheet (61) as shown in FIG. 16 in which a large number of conductive portions (13) and adhesive portions (15) are formed, with a large number of conductive contacts (14) being exposed on the surfaces thereof (In FIG. 16, the larger circles represent the conductive portions (13), and the smaller circles represent the adhesive portions (15)). Further, it is also possible to cut off a part (region R of FIG. 16) of the anisotropic conductive sheet (61) to produce, for example, an anisotropic conductive sheet (11) with two conductive portions (13), or cut the anisotropic conductive sheet (61) in an appropriate size according to the use. By producing an anisotropic conductive sheet (61a) as shown in FIG. 17, it is possible to cut off and produce anisotropic conductive sheets (11) efficiently without wasting any portion of the anisotropic conductive sheet (61a). Further, it is also possible to form an anisotropic conductive sheet (61b) as shown in FIG. 18 in which the adhesive portions (15) are formed in a linear fashion.

Figure 19A:
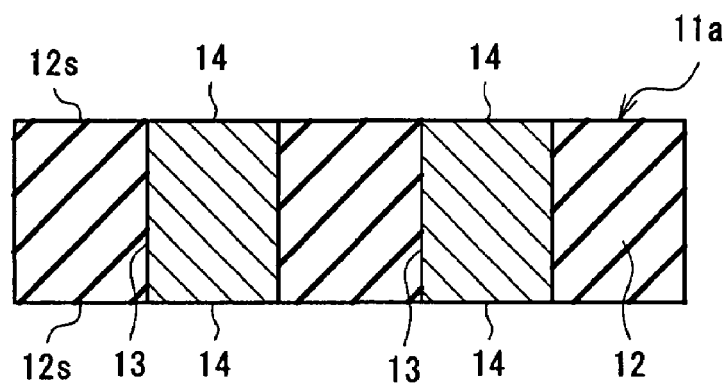
Figure 19B:
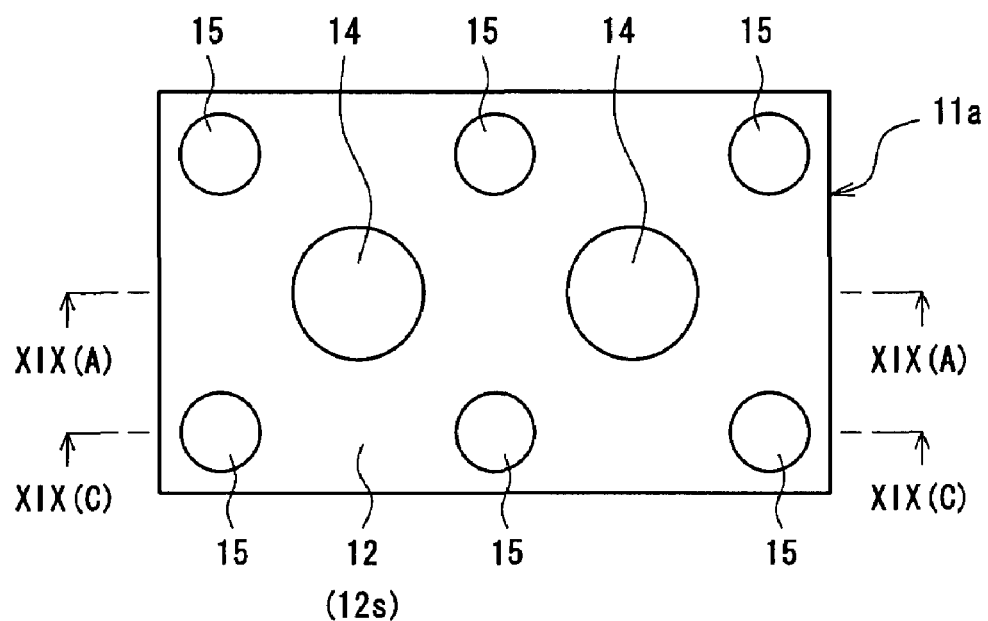
Figure 19C:
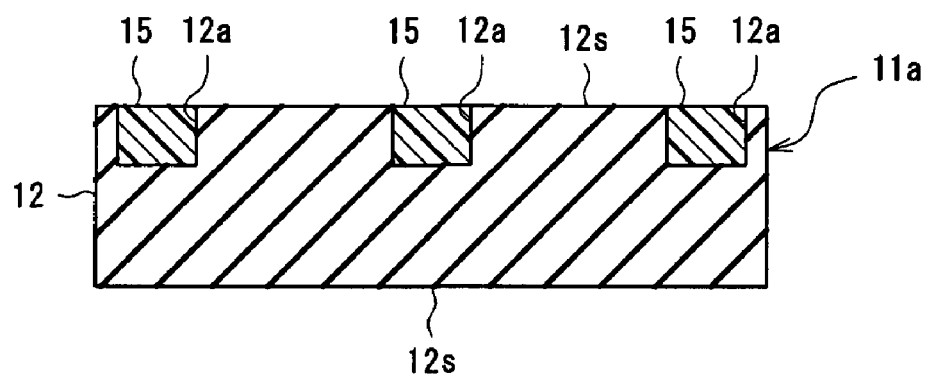
Figure 20:
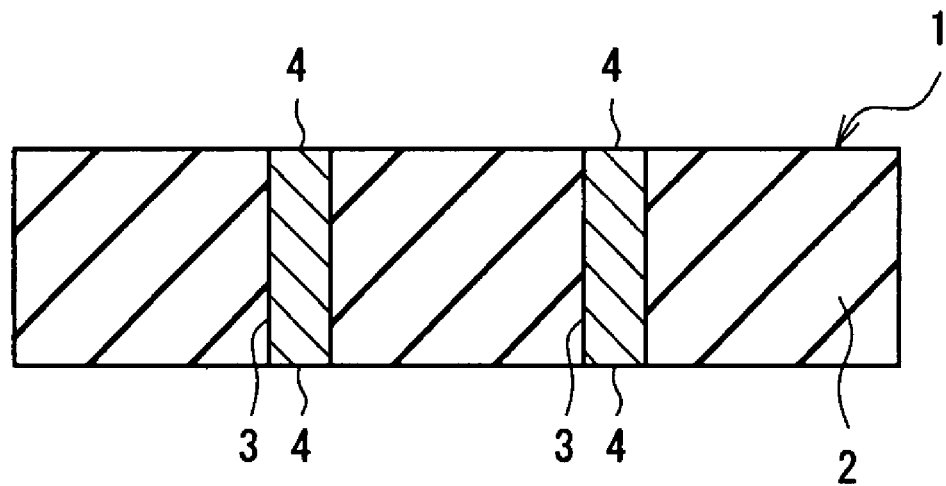
FIG. 20 is a sectional view of a conventional anisotropic conductive sheet.
Figure 21:
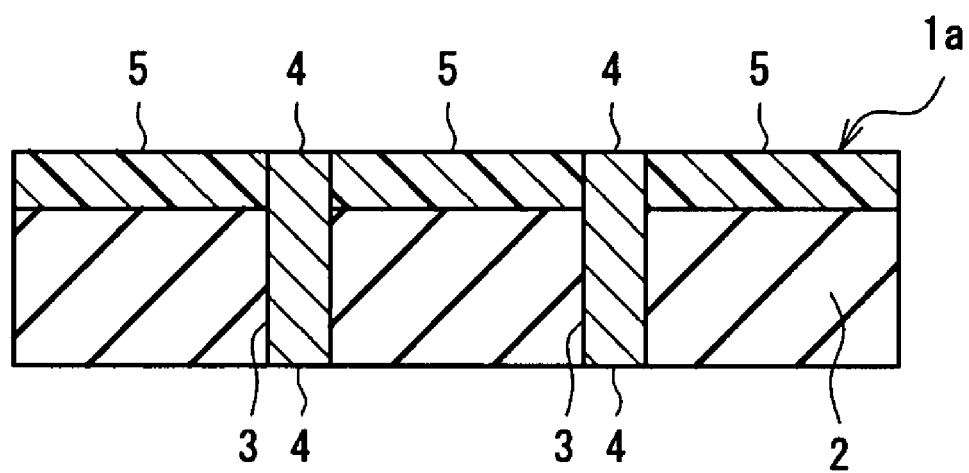
FIG. 21 is a sectional view of another conventional anisotropic conductive sheet.

Further, while in the anisotropic conductive sheet of each of the above embodiments (11, 21, 21a, 21b, 21c, 31, 41, 41a, 41b, 41c, 51, 61, 61a, 61b) the adhesive portions (15) are provided on both of the surfaces (12s) in the thickness direction of the base portion (12), it is also possible to provide the adhesive portions (15) on only one of the two surfaces. For example, FIGS. 19(A) through 19(C) show an anisotropic conductive sheet (11a) according to a modification of the anisotropic conductive sheet (11) of the first embodiment in which the adhesive portions (15) are provided on one side only.

What is claimed is:

1. An anisotropic conductive sheet, comprising:
   an insulating base portion; and
   a plurality of conductive portions extending through the base portion in a thickness direction thereof, wherein:
   the base portion has surfaces through which the plurality of conductive portions are exposed to an outside to form conductive contacts;
   the surfaces have an adhesive portion spaced apart from the conductive contacts;
   the base portion is provided with a protrusion protruding in the thickness direction thereof; and
   the adhesive portion is provided on the protrusion.

2. An anisotropic conductive sheet according to claim 1, wherein the adhesive portion is provided on both of the surfaces of the base portion having the conductive contacts.

3. An anisotropic conductive sheet according to claim 1, wherein the adhesive portion is provided on one of the surfaces of the base portion having the conductive contacts.

4. An anisotropic conductive sheet according to claim 1, wherein the adhesive portion protrudes outwardly beyond surfaces of the conductive contacts.

5. An anisotropic conductive sheet according to claim 1, wherein:
   the conductive portion protrudes in the thickness direction of the base portion beyond the surface of the base portion; and
   the adhesive portion is provided on the surface of the base portion recessed from surfaces of the conductive contacts.

6. An anisotropic conductive sheet according to claim 1, wherein the adhesive portion is formed in a dotted fashion.

7. An anisotropic conductive sheet according to claim 1, wherein the adhesive portion is formed in a linear fashion.

8. An anisotropic conductive sheet according to claim 1, wherein the conductive portions are formed through connection of conductive particles in the thickness direction of the base portion.

9. An anisotropic conductive sheet comprising:
   an insulating base portion; and
   a plurality of conductive portions extending through the base portion iii a thickness direction thereof wherein:
   the base portion has surfaces through which the plurality of conductive portions are exposed to an outside to form conductive contacts;
   the surfaces have an adhesive portion spaced apart from the conductive contacts,
   the conductive portions protrude in the thickness direction of the base portion beyond the surfaces of the base portion; and
   the base portion has a protrusion protruding in the thickness direction thereof, with the adhesive portion being provided on the protrusion.

* * * * *